United States Patent
Nakatsuka et al.

(10) Patent No.: US 6,720,705 B2
(45) Date of Patent: Apr. 13, 2004

(54) METHOD OF DRIVING A PIEZOELECTRIC TRANSFORMER AND POWER SOURCE APPARATUS USING THE SAME

(75) Inventors: Hiroshi Nakatsuka, Osaka (JP); Takeshi Yamaguchi, Kanagawa (JP); Katsu Takeda, Osaka (JP); Katsunori Moritoki, Osaka (JP); Kojiro Okuyama, Nara (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/930,184

(22) Filed: Aug. 16, 2001

(65) Prior Publication Data

US 2002/0024269 A1 Feb. 28, 2002

(30) Foreign Application Priority Data

Aug. 21, 2000 (JP) .......................... 2000-249751

(51) Int. Cl.⁷ .................... H01L 41/06; H01L 41/08; H01N 2/00
(52) U.S. Cl. ................... 310/316.01; 310/318; 310/359
(58) Field of Search ............. 310/316.01, 318, 310/359

(56) References Cited

U.S. PATENT DOCUMENTS

| | | | |
|---|---|---|---|
| 5,705,877 A | * | 1/1998 | Shimada ............... 310/318 |
| 5,705,879 A | * | 1/1998 | Abe et al. ............. 310/359 |
| 5,731,652 A | | 3/1998 | Shimada |
| 5,859,489 A | * | 1/1999 | Shimada ............... 310/318 |
| 5,894,184 A | * | 4/1999 | Furuhashi et al. ..... 310/316.01 |
| 5,894,185 A | * | 4/1999 | Asada et al. ............. 310/368 |
| 5,923,456 A | * | 7/1999 | Tench et al. ............. 359/266 |
| 5,998,937 A | * | 12/1999 | Nishigaki ............. 315/209 PZ |
| 6,028,388 A | * | 2/2000 | Shimada ............... 310/318 |
| 6,051,915 A | * | 4/2000 | Katsuno et al. ........... 310/359 |
| 6,075,325 A | * | 6/2000 | Kouno et al. ............. 315/307 |
| 6,433,458 B2 | * | 8/2002 | Nakatsuka et al. .... 310/316.01 |

FOREIGN PATENT DOCUMENTS

JP          9-135573          5/1997

OTHER PUBLICATIONS

English Language Abstract of JP 9–135573.

* cited by examiner

*Primary Examiner*—Burton S. Mullins
*Assistant Examiner*—J. Aguirrechea
(74) *Attorney, Agent, or Firm*—Greenblum & Bernstein, P.L.C.

(57) ABSTRACT

The invention provides a method of driving a piezoelectric transformer and a power source apparatus using the same. For a circuit for driving a piezoelectric transformer which steps up a voltage input from a primary electrode by a piezoelectric effect to output the stepped up voltage from a secondary electrode, the gradient (linear differential value) of a step-up ratio at the piezoelectric transformer is detected, and the detected gradient is used to control the driving frequency for the piezoelectric transformer so that the driving frequency approaches to the resonant frequency of the piezoelectric transformer.

21 Claims, 19 Drawing Sheets

311u ELECTRODE   313 SENSOR ELECTRODE

311d ELECTRODE   319 PIEZPELECTRIC MATERIAL   312

→ P : DIRECTION OF POLARIZATION

METHOD OF DRIVING A PIEZOELECTRIC TRANSFORMER AND POWER SOURCE APPARATUS USING THE SAME

BACKGROUND OF THE INVENTION

1. Field of the Invention

The present invention relates to a method of driving a piezoelectric transformer used in a high-voltage generator, and to a power source apparatus employing the piezoelectric transformer.

2. Description of the Related Art

FIG. 16 illustrates a structure of a Rosen piezoelectric transformer which is one of typical piezoelectric transformers. Favorably, such the piezoelectric transformers can be sized smaller in the dimensions than electromagnetic transformers as is nonflammable and free from noises due to electromagnetic induction.

As shown in FIG. 16, the piezoelectric transformer comprises a low-impedance section 301 and a high-impedance section 302. The low-impedance section 301 acts as an input section when used for stepping up. The section 301 is polarized along the thickness direction, and has two electrodes 303$u$ and 303$d$ provided on both principle faces of the thickness direction. The high-impedance section 302 acts as an output section when used for stepping up. The section 302 is polarized along the long direction, and has an electrode 304 provided on a face of the long direction.

FIG. 17 shows a frequency response of the above described piezoelectric transformer. Recently the piezoelectric transformer has been used as a power source for a cold cathode ray tube because it has characteristics in that, the greater the load, the higher the step-up ratio increases (curve P1) and the smaller the load, the lower the step-up ratio decreases (curve P2).

The piezoelectric transformer may be driven by a separately-excited oscillator circuit which is provided with an external oscillator. FIG. 18 is a block diagram of a conventional drive circuit with a separately-excited oscillation method employing the Rosen-type piezoelectric transformer.

As shown in FIG. 18, a variable oscillator circuit 221 generates an alternating-current drive signal of which frequency is close to the resonant frequency of a piezoelectric transformer 110. The output signal of the variable oscillator circuit 221 contains other alternating-current signal components than the driving frequency signal. Those signal components generate heat or a loss in the piezoelectric transformer 110. To reduce the loss in the piezoelectric transformer 110, the output signal is shaped to substantially a sine wave by a waveform shaping circuit 224. The waveform shaping circuit 224 may simply be a band-pass filter for reducing harmonic components. The output of the waveform shaping circuit 224 is then amplified by a drive circuit 225 to a current level or a voltage level enough to actuate the piezoelectric transformer 110. The drive circuit 225 may comprise only a normal amplifier circuit composed of transistors, or a combination of an amplifier circuit and a step-up transformer. The output of the drive circuit 225 is stepped up by the piezoelectric transformer 110, applied to a load such as a cold cathode fluorescent lamp 108 to light on.

The piezoelectric transformer 110 may be varied in the resonant frequency depending on the ambient conditions including the temperature and the load. Therefore when the piezoelectric transformer 110 is driven at a constant frequency by the circuit shown in FIG. 18, relative relation between the resonant frequency and the driving frequency will change. More specifically, in case that the driving frequency is largely differentiated from the resonant frequency of the piezoelectric transformer 110, the voltage step-up ratio of the piezoelectric transformer 110 will decline significantly thus lowering the output voltage. As a result, the cold cathode fluorescent lamp 108 as a load may be supplied with insufficient current and fail to provide a desired level of luminance.

FIG. 19 is a block diagram of another conventional circuit for driving the piezoelectric transformer different from the circuit shown in FIG. 16 which can prevail over a change in the resonant frequency of the piezoelectric transformer 110. The cold cathode fluorescent lamp 108 serving as a load in the circuit is connected in series with a feedback resistor 109 having a small resistance. The feedback resistor 109 detects a current across the cold cathode fluorescent lamp 108. A resultant voltage across the feedback resistor 109 which is proportional to the current flowing through the cold cathode fluorescent lamp 108 is fed into a current detector circuit 232. An output of the current detector circuit 232 is applied to an oscillation control circuit 214. The oscillation control circuit 214 in turn controls the frequency of the output of the variable oscillator circuit 221 so that the voltage across the feedback resistor 109 or the current across the cold cathode fluorescent lamp 108 can be constant. This control permits the cold cathode fluorescent lamp 108 to light up at substantially a uniform level of luminance.

FIG. 20 is a block diagram of another modification of the conventional circuit for driving the piezoelectric transformer shown in FIG. 16 which can prevail over a change in the resonant frequency of the piezoelectric transformer. In this modification, the current across the cold cathode fluorescent lamp 108 is detected by the feedback resistor 109. When the resonant frequency of the piezoelectric transformer 110 is varied with a change in the load or the ambient conditions, the current across the cold cathode fluorescent lamp 108 may change. The voltage across the feedback resistor 109 which is proportional to the current across the cold cathode fluorescent lamp 108 is fed into the current detector circuit 232. The output of the current detector circuit 232 is then fed into a pulse width control circuit 223. The pulse width control circuit 223 in turns generates and delivers a control signal to a pulse width modifying circuit 222 so that the voltage across the feedback resistor 109 or the current across the cold cathode fluorescent lamp 108 can be constant. Upon receiving the control signal, the pulse width modifying circuit 222 adjusts the pulse width of the output signal to determine the amplitude of the voltage applied to the cold cathode fluorescent lamp 108. This control permits the cold cathode fluorescent lamp 108 to light up at substantially a uniform level of luminance.

As described above, the conventional drive circuit using the piezoelectric transformer controls the driving frequency of the piezoelectric transformer to keep a level of output current flowing through the load connected to the piezoelectric transformer constant. That is, to increase the output current, the driving frequency is kept away from the resonant frequency. In the conventional circuit, however, once the source voltage is declined, it becomes impossible to flow a sufficient level of current through the piezoelectric transformer even though the driving frequency is forced to match the resonant frequency. Thus, a desired level of the output current can not be provided. In reverse, when the source voltage is increased, the driving frequency is differentiated from the resonant frequency of the piezoelectric transformer hence lowering the driving efficiency. Also, in case that the load to the piezoelectric transformer is largely changed, simultaneously, the output current of the piezoelectric transformer can hardly be controlled to a specified value, and the driving frequency may be differentiated from the resonant frequency of the piezoelectric transformer, hence lowering largely the driving efficiency.

There are some techniques to modify the output voltage of the drive circuit without changing the driving frequency when the source voltage is varied or the load to the piezoelectric transformer is varied. One of the most known techniques is to modify the pulse width of the output voltage of the drive circuit. In this case, the narrower the pulse width or the smaller the duty, the greater harmonic components other than the basic driving frequencies will increase. As the harmonic components turn to thermal loss in the piezoelectric transformer, the driving efficiency and the operational reliability will be declined largely.

For solving the above drawbacks, a method is disclosed in Japanese Patent Laid-open Publication No. 9-135573. The method detects the relation between the resonant frequency and the driving frequency of the piezoelectric transformer through measuring a difference in the phase of current or voltage between the input and the output, and performs the frequency control while the frequency is within a predetermined range, or modifies the input power so as to keep a constant level of current across the cold cathode fluorescent lamp when the frequency is at the maximum or minimum limit of the range. However, the phase of the voltage or current of the input or output of the piezoelectric transformer is varied depending on the load. It is hence necessary for detecting the relation between the resonant frequency and the driving frequency of the piezoelectric transformer to perform adjustment depending on the inverter and the piezoelectric transformer.

SUMMARY OF THE INVENTION

The present invention is directed to eliminate the above drawbacks and its object is to provide a method of driving a piezoelectric transformer and a power source apparatus which can keep normal operation even though the source voltage or the load to the piezoelectric transformer changes largely, thus providing the high driving efficiency, the high operational reliability and the high durability in the piezoelectric transformer.

In a first aspect of the invention, provided is a method of driving a piezoelectric transformer which has a primary electrode and a secondary electrode, and which steps up a voltage input at the primary electrode with a step-up ratio which varies depending on a frequency according to a piezoelectric effect and outputs the stepped-up voltage from the secondary electrode. The method comprises detecting a linear differential value of the step-up ratio of the piezoelectric transformer with respect to the frequency, and controlling the driving frequency for the piezoelectric transformer according to the detected linear differential.

In a second aspect of the invention, provided is a method of driving a piezoelectric transformer which has a primary electrode, a secondary electrode and a third electrode and which steps up a voltage input at the primary electrode with a step-up ratio which varies depending on a frequency by a piezoelectric effect, and outputs the stepped up voltage from the secondary electrode and the third electrode. The method comprises detecting a linear differential value of a voltage ratio between the voltage input at the primary electrode and the voltage output from the third electrode to the frequency, and controlling the driving frequency for the piezoelectric transformer according to the detected linear differential value of the voltage ratio.

In a third aspect of the invention, provided is a method of driving a piezoelectric transformer which has a primary electrode, a secondary electrode and a third electrode, and which steps up a voltage input at the primary electrode with a step-up ratio which varies depending on a frequency by a piezoelectric effect, and outputs the stepped up voltage from the secondary electrode and the third electrode. The method comprises detecting a phase difference between the voltage input at the primary electrode and the voltage output from the third electrode, and controlling the driving frequency for the piezoelectric transformer according to the detected phase difference.

In a fourth aspect of the invention, a power source apparatus comprises a piezoelectric transformer with a primary electrode and a second electrode for stepping up a voltage input at the primary electrode by the piezoelectric effect to output the stepped-up voltage from the secondary electrode, a driving section for driving the piezoelectric transformer at a desired voltage and at a desired frequency, a current detecting section for measuring a current across a load which is driven by the voltage output from the secondary electrode of the piezoelectric transformer, a step-up ratio differential detecting section for determining a linear differential value of the step-up ratio of the piezoelectric transformer with respect to the frequency, and a control section for controlling the driving frequency and the driving voltage for the piezoelectric transformer according to the current across the load detected by the current detecting section and the linear differential value determined by the step-up ratio differential detecting section.

In a fifth aspect of the invention, a power source apparatus comprises a piezoelectric transformer with a primary electrode, a secondary electrode and a third electrode for stepping up a voltage input at the primary electrode by the piezoelectric effect to output the stepped up voltage from the secondary electrode and the third electrode, a driving section for driving the piezoelectric transformer at a desired voltage and at a desired level frequency, a current detecting section for detecting a current across a load which is driven by the voltage output from the secondary electrode of the piezoelectric transformer, a step-up ratio differential detecting section for determining a linear differential value of a voltage ratio between the driving voltage for the piezoelectric transformer and the voltage output from the third electrode, to the frequency, and a control section for controlling the driving frequency and the driving voltage for the piezoelectric transformer based on the current detected by the current detecting section and the linear differential value of the step-up ratio determined by the step-up ratio detecting section so that the current across the load is at a predetermined level.

In a sixth aspect of the invention, a power source apparatus comprises a piezoelectric transformer with a primary electrode, a secondary electrode and a third electrode for stepping up a voltage input at the primary electrode by the piezoelectric effect to output the stepped up voltage from the secondary electrode and the third electrode, a driving section for driving the piezoelectric transformer at a desired voltage and at a desired frequency, a current detecting section for detecting a current across a load which is driven by a voltage output from the secondary electrode of the piezoelectric transformer, a phase difference detecting section for detecting a phase difference between the voltage input to the primary electrode and the voltage output from the third electrode in the piezoelectric transformer, and a control section for controlling the driving frequency and driving voltage for the piezoelectric transformer based on the current detected by the current detecting section and the phase difference detected by the phase difference detecting section so that the current across the load is at a predetermined level.

BRIEF DESCRIPTION OF THE DRAWINGS

FIGS. 14A is a diagram showing frequency response of the step-up ratio of a piezoelectric transformer in the driving circuit of the fifth embodiment after lighting on;

FIGS. 14B is a diagram showing frequency response of the step-up ratio of a piezoelectric transformer in the driving circuit of the fifth embodiment before lighting on;

DETAILED DESCRIPTION OF PREFERRED EMBODIMENTS

A method of driving a piezoelectric transformer and a circuit as the power source for driving the piezoelectric transformer according to the present invention will be described below in more detail referring to the accompanying drawings.

First Embodiment

Figure 1:
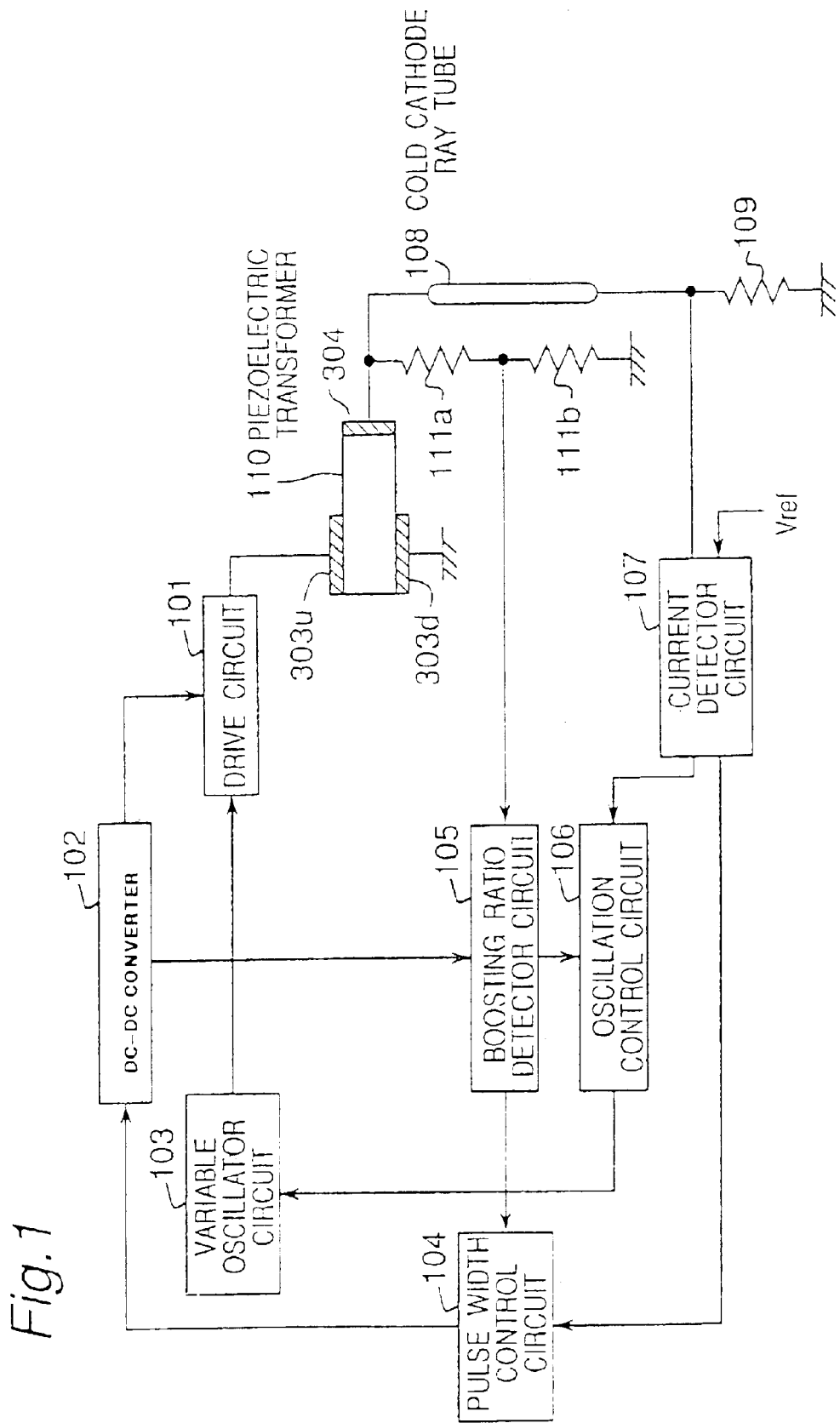
FIG. 1 is a block diagram of the first embodiment of the piezoelectric transformer driving circuit according to the present invention.

FIG. 1 is a block diagram showing the first embodiment of the circuit for driving the piezoelectric transformer according to the present invention.

Figure 2:
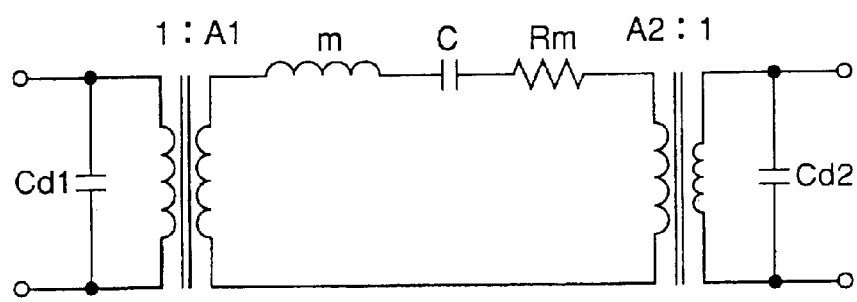
FIG. 2 is a diagram illustrating an equivalent circuit of a Rosen-type piezoelectric transformer.
Figure 16:
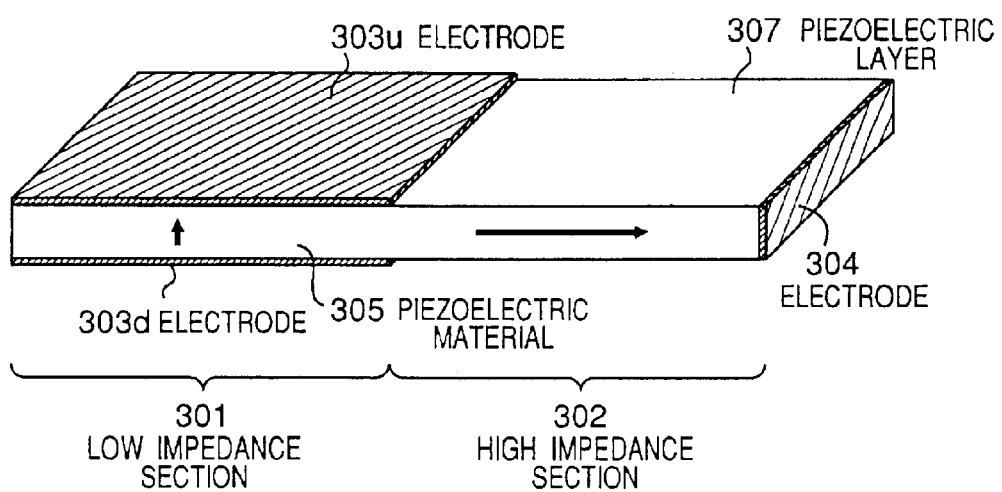
FIG. 16 is a perspective view showing a conventional Rosen-type piezoelectric transformer.
Figure 17:
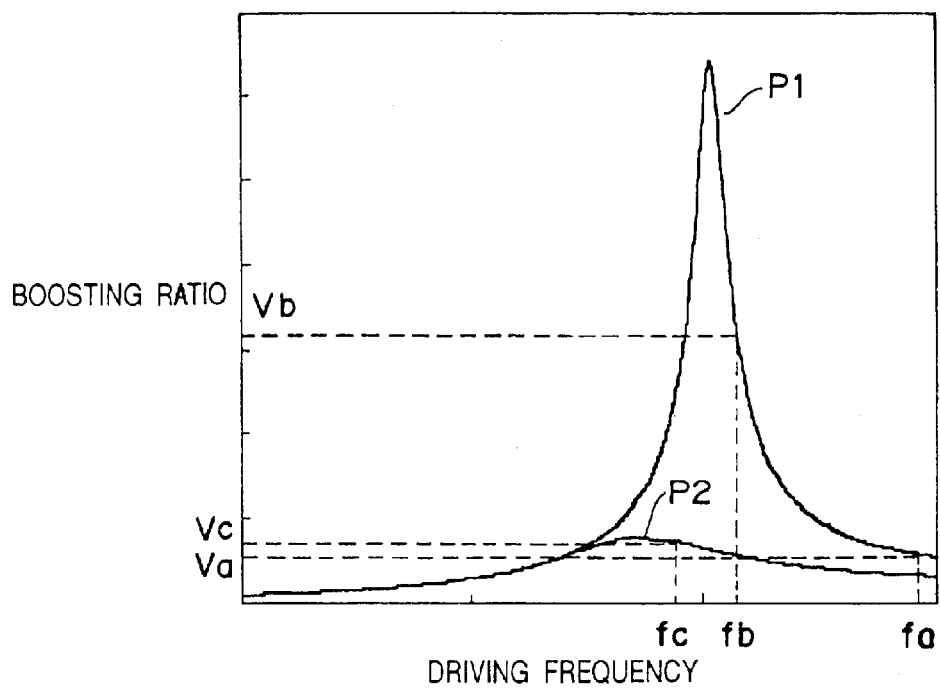
FIG. 17 is a diagram showing a frequency response of the Rosen-type piezoelectric transformer.
Figure 18:
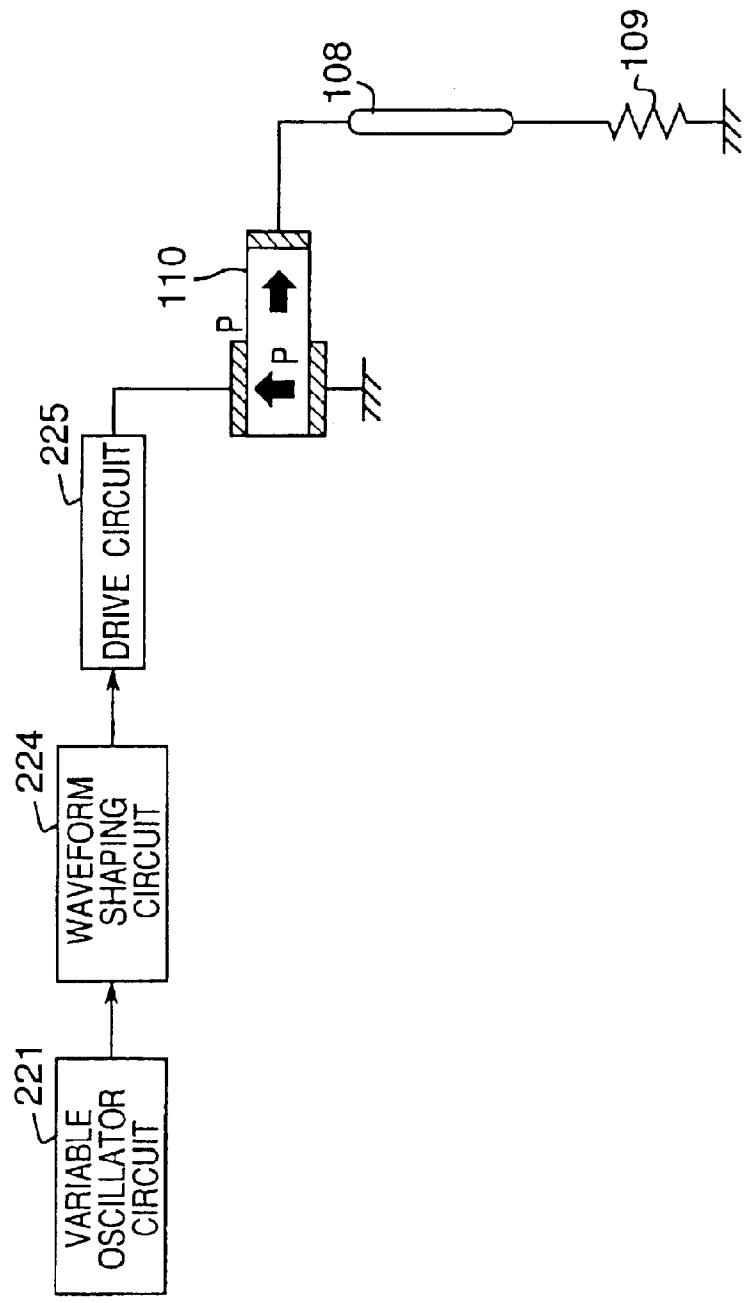
FIG. 18 is a block diagram of a conventional circuit for driving the Rosen-type piezoelectric transformer.
Figure 19:
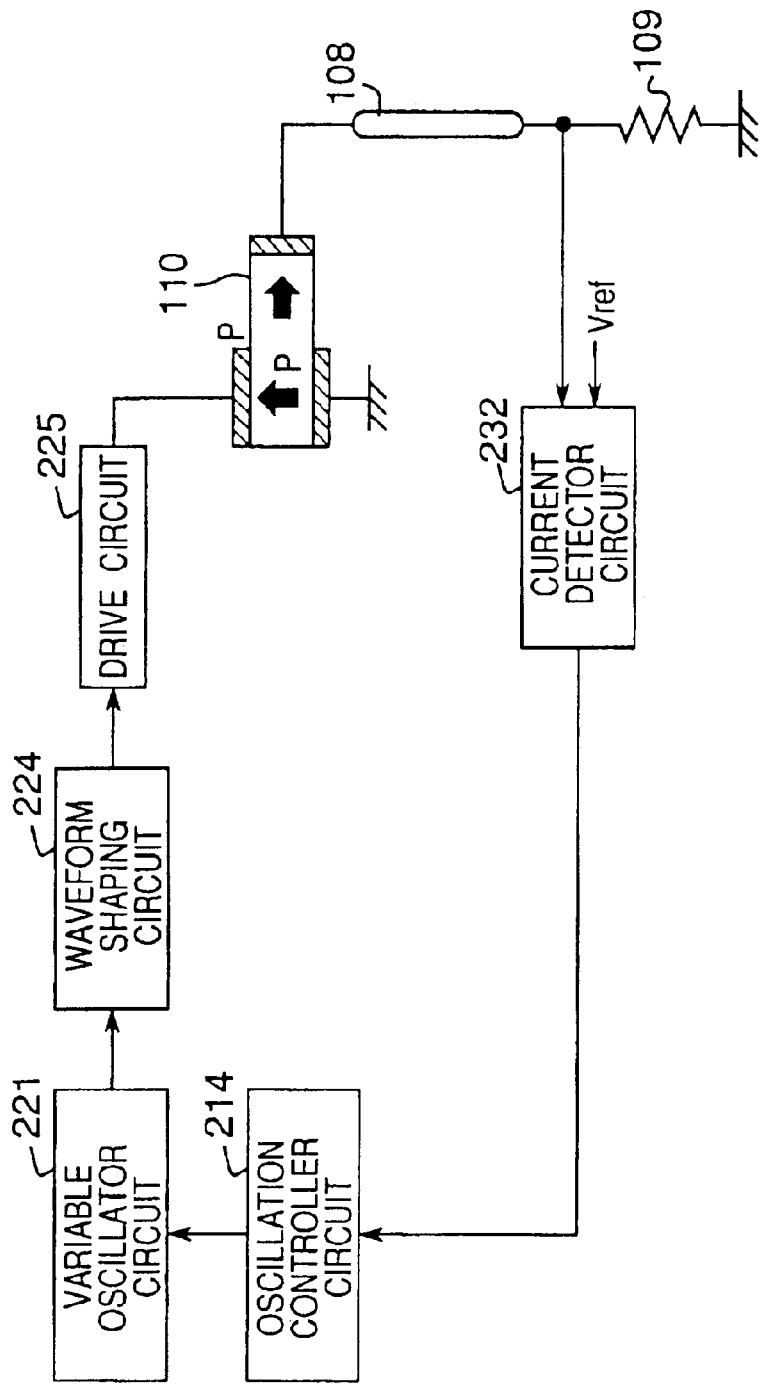
FIG. 19 is a block diagram of another conventional circuit for driving the Rosen-type piezoelectric transformer.
Figure 20:
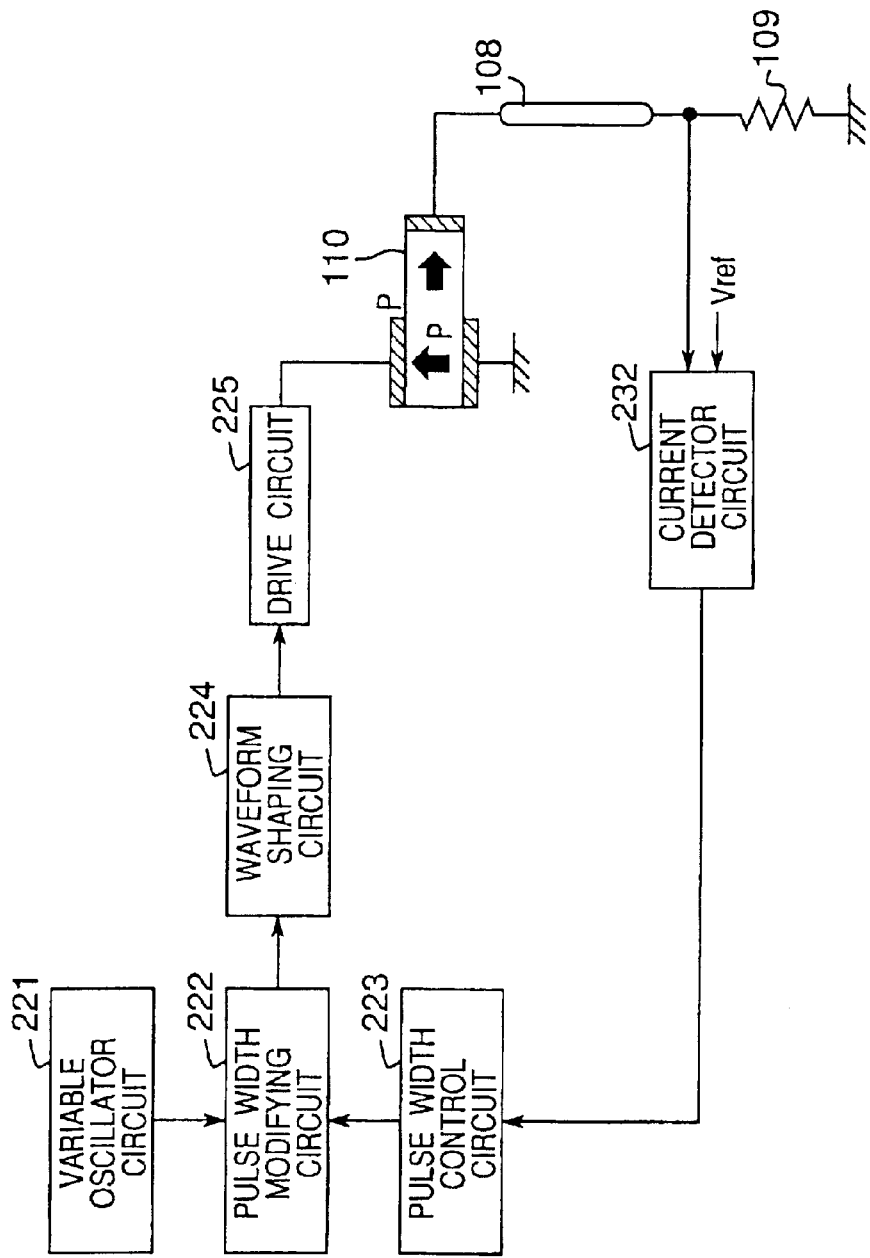
FIG. 20 is a block diagram of a further conventional circuit for driving the Rosen-type piezoelectric transformer.

The piezoelectric transformer 110 provided in the piezoelectric transformer driving circuit (a piezoelectric inverter) shown in FIG. 1 is a Rosen-type piezoelectric transformer such as shown in FIG. 16. FIG. 2 illustrates a concentrated constant approximation equivalent circuit at a frequency close to the resonance frequency of the piezoelectric transformer. The equivalent circuit may be expressed by the clamped capacitances Cd1 and Cd2 at the input and output sides respectively, the force factor A1 at the input side, the force factor A2 at the output side, the equivalent mass m, the equivalent compliance C, and the equivalent mechanical resistance Rm. In this embodiment, the force factor A1 of the piezoelectric transformer 110 is greater than force factor A2 and can be stepped up by two equivalent ideal transformers shown in FIG. 2. The piezoelectric transformer also includes a serial resonance circuit composed of the equivalent mass m and the equivalent compliance C. When the resistance of a load is large, the voltage output may be increased to greater than a transformation ratio of the transformer.

Returning to FIG. 1, the configuration and action of the circuit for driving the piezoelectric transformer will now be explained.

In the action of the circuit, a variable oscillator circuit 103 generates an alternating current drive signal for driving the piezoelectric transformer 110. The output of the variable oscillator circuit 103 is then amplified by a drive circuit 101 to a voltage level enough to drive the piezoelectric transformer 110 and transferred to primary electrodes 303u and 303d of the piezoelectric transformer 110. The output voltage of the piezoelectric transformer 110 stepped up by the piezoelectric effect thereof is output from a secondary electrode 304 thereof.

The high voltage output from the secondary electrode 304 of the piezoelectric transformer 110 is applied to a serially connected combination of a cold cathode fluorescent lamp 108 (referred to as "a cold cathode lamp" hereinafter) and a feedback resistor 109. A couple of voltage dividing resistors 111a and 111b are connected in parallel with the cold cathode lump 108.

A step-up ratio detector circuit 105 compares the voltage at both ends of the voltage dividing resistor 111b with the voltage received by the drive circuit 101 to determine a ratio between the high voltage output from the secondary electrode 304 of the piezoelectric transformer 110 and the voltage received by the drive circuit 101. The step-up ratio detector circuit 105 also detects or measures a rate of change (a gradient or linear differential value) in the step-up ratio with respect to the frequency.

The voltage developed across the feedback resistor 109 is applied to a current detector circuit 107. The current detector circuit 107 in turn refers a reference voltage Vref to generate and deliver a detection signal indicative of the voltage across the feedback resistor 109 to both an oscillation control circuit 106 and a pulse width control circuit 104.

The oscillation control circuit 106 and the pulse width control circuit 104 performs a predetermined control action for providing a constant level of current across the cold cathode lump 108, based on the output of the current detector circuit 107 and the output of the step-up ratio detector circuit 105.

Figure 3A:
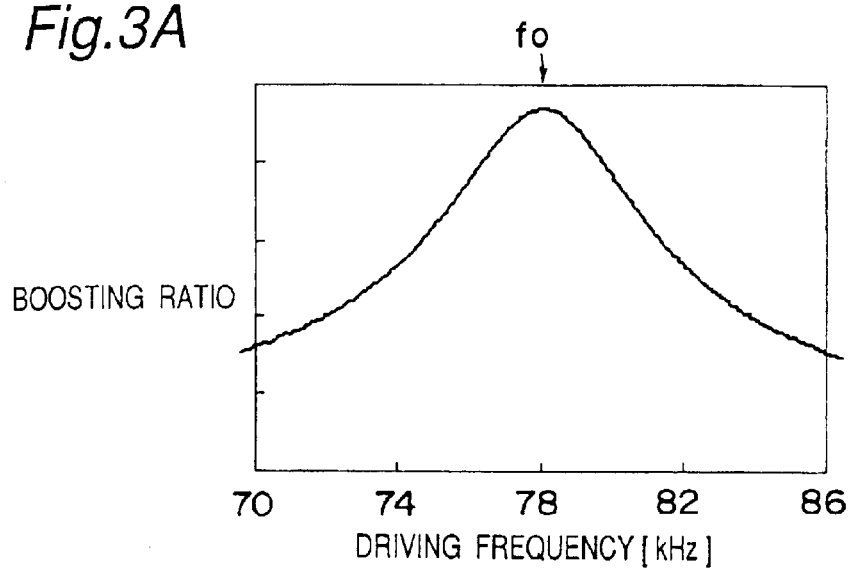
FIG. 3A is a diagram showing a frequency response of a step-up ratio at the Rosen-type piezoelectric transformer.
Figure 3B:
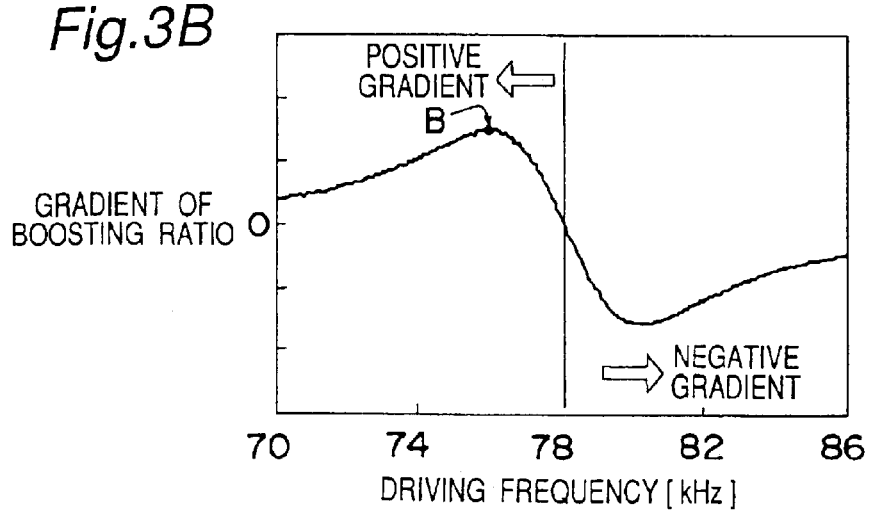
FIG. 3B is a diagram showing a frequency response of a gradient of the step-up ratio.

As to the driving circuit of the piezoelectric transformer thus configured, a control of the driving frequency and a control of the input voltage by the current detector circuit 107 and the step-up ratio detector circuit 105 will be explained, referring to FIGS. 3A and 3B. FIGS. 3A and 3B illustrate operation characteristics of the piezoelectric transformers. FIG. 3A shows the relation between the frequency along the horizontal axis and the step-up ratio of the piezoelectric transformer along the vertical axis with the cold cathode lamp being lit up. FIG. 3B shows the relation between the frequency along the horizontal axis and the gradient of the step-up ratio of the piezoelectric transformer along the vertical axis. In brief, the curve shown in FIG. 3B is obtained by differentiating linearly the curve shown in FIG. 3A.

In the piezoelectric transformer driving circuit shown in FIG. 1, when the current (lamp current) across the cold cathode lump 108 is smaller than a current setting level (value), the lump current has to be increased. In this case, the lamp current can be increased by i) approximating the driving frequency of the piezoelectric transformer 110 to the resonant frequency f0 to drive at a higher level of the step-up ratio, or ii) increasing the input voltage of the piezoelectric transformer 110 to raise the output voltage.

In case that, in the current detector circuit 107, the current across the cold cathode lump 108 (detected from the voltage across the feedback resistor 109) is smaller than the current setting level (equivalent to Vref) and the gradient of the step-up ratio detected by the step-up ratio detector circuit 105 is negative, the relation between the resonant frequency (f0) and the driving frequency is expressed with reference to FIG. 3B as follows.

(Resonant frequency)<(Driving frequency)

For approximating the lamp current to the current setting level, the driving frequency is shifted toward the lower side and thus approximating to the resonant frequency. Then, when the gradient of the step-up ratio returns back to zero (at the maximum of the step-up ratio of the piezoelectric transformer) and the lamp current becomes smaller than the current setting level, the sweep of the driving frequency by the oscillation control circuit 106 is stopped and the pulse width control circuit 104 controls a DC—DC converter 102 so as to increase the input voltage of the piezoelectric transformer 110.

When the gradient of the step-up ratio is positive, the relation between the resonant frequency and the driving frequency is expressed with reference to FIG. 3B as follows.

(Resonant frequency)>(Driving frequency)

Accordingly, the driving frequency is increased so that the driving frequency approaches to the resonant frequency. When the gradient of the step-up ratio reaches zero (corresponding to the maximum step-up ratio of the piezoelectric transformer) and the lamp current becomes smaller than the current setting level, the sweep of the driving frequency by the oscillation control circuit 106 is canceled, and then the pulse width control circuit 104 control the DC—DC converter 102 so as to increase the input voltage of the piezoelectric transformer 110.

Alternatively, when the current across the cold cathode lump 108 is greater than the current setting level, the current has to be decreased. In this case, the lamp current can be reduced by i) changing the driving frequency of the piezoelectric transformer 110 away from the resonant frequency in order to drive the transformer at a lower level of the step-up ratio, or ii) decreasing the input voltage of the piezoelectric transformer 110 to lower the output voltage.

In case that the current across the cold cathode lump 108 detected by the current detector circuit 107 is greater than the current setting level and that the gradient of the step-up ratio detected by the step-up ratio detector circuit 105 is negative, the relation between the resonant frequency and the driving frequency, with reference to FIG. 3B, is expressed by (Resonant frequency)<(Driving frequency).

Accordingly, the pulse width control circuit 104 supplies the DC—DC converter 102 with a control signal for decreasing the input voltage of the piezoelectric transformer 110. This allows the piezoelectric transformer 110 to be driven at a frequency close to the resonant frequency which improves the efficiency of the conversion. When the input voltage of the piezoelectric transformer 110 drops down to the minimum of a predetermined range, the driving frequency is shifted toward the higher side until the lamp current reaches the current setting level.

Alternatively, when the gradient of the step-up ratio is positive, the relation between the resonant frequency and the driving frequency, with reference to FIG. 3, is expressed by (Resonant frequency)>(Driving frequency).

Accordingly, the driving frequency of the piezoelectric transformer 110 is increased close to the resonant frequency. In this case, the step-up ratio temporarily rises up to increase the lamp current. The control is done such that the piezoelectric transformer 110 is not driven in a frequency range smaller than the resonant frequency in which non-linear effects may appear. When the gradient of the step-up ratio reaches zero (corresponding to the maximum step-up ratio) and the lamp current is greater than the current setting level, the sweep of the driving frequency by the oscillation control circuit is canceled. Then, the pulse width control circuit 104 modifies the pulse width so as to decrease the input voltage of the piezoelectric transformer 110.

In this embodiment, the control is carried out so that the driving frequency is not lower than the resonant frequency, as much as possible. Alternatively, when the piezoelectric transformer 110 can be driven linearly within a power range to be treated, the control may be performed so as to make the driving frequency distant from the resonant frequency.

This embodiment determines no particular range of the driving frequency for control, but the piezoelectric transformer 110 can be driven with a higher efficiency at around the resonant frequency. Therefore the driving frequency may preferably be confined within a range adjacent to but not departed further from the resonant frequency. As the piezoelectric transformer 110 is efficiently driven at such a range of frequencies, it can be improved in the operational reliability and provide the inverter circuit with high efficiency.

In this embodiment, to control the piezoelectric transformer 110 according to a gradient of the step-up ratio, the piezoelectric transformer 110 is controlled at a frequency in a range having the resonant frequency at the center. In case that the piezoelectric transformer is of a piezoelectric ceramic type, its non-linear characteristics may cause unstable actions at a frequency lower than the resonant frequency. Accordingly, it is preferable to control at a frequency range in which the gradient of the step-up ratio (i.e. at a frequency not lower than the resonant frequency) is negative. In this case, the driving frequency is set so as not to exceed a predetermined setting value and be closer to the resonant frequency, and when the driving frequency reaches the minimum of the setting range, the input voltage is modified or controlled. As described above, a control range of the driving frequency is set in advance, and the input voltage is modified by the pulse width control when the driving frequency reaches the maximum or minimum in the set frequency range. Thus, the operation of the piezoelectric transformer can be operated stably.

In this embodiment, the driving frequency for the piezoelectric transformer 110 is swept at a constant speed independent of a change rate of the gradient. It is, however, preferable to change (modify) the sweep speed (rate) of the driving frequency according to the step-up ratio of the piezoelectric transformer which varies in accordance with the driving frequency. More particularly, when the piezoelectric transformer 110 is driven at a frequency close to the resonant frequency to minimize a change in the mechanical vibration during the sweep of the driving frequency, it is preferable to reduce the change rate of the driving frequency to a smaller level than the change rate for driving at a frequency distant from the resonant frequency. That is, when the driving frequency is close to the resonant frequency, it is preferable to reduce the sweep speed of the driving frequency as the change rate in the step-up ratio of the piezoelectric transformer becomes higher. As the driving frequency is thus controlled, the piezoelectric transformer 110 can be driven at a higher reliability with any frequency close to the resonant frequency.

In this embodiment, the piezoelectric transformer 110 is connected at its secondary side to the voltage dividing resistors 111a and 111b to measure the step-up ratio of the transformer 110 from the output of the transformer 110 and the input from DC—DC converter 102. Another method can be used to measure the step-up ratio, thereby the same control can be performed (this is applicable to the following embodiments).

While the input voltage of the piezoelectric transformer 110 is determined by a combination of the pulse width control circuit 104 and the DC—DC converter 102 in this embodiment, another method can control the input voltage to provide the same control (this is applicable to the following embodiments).

Second Embodiment

Figure 4:
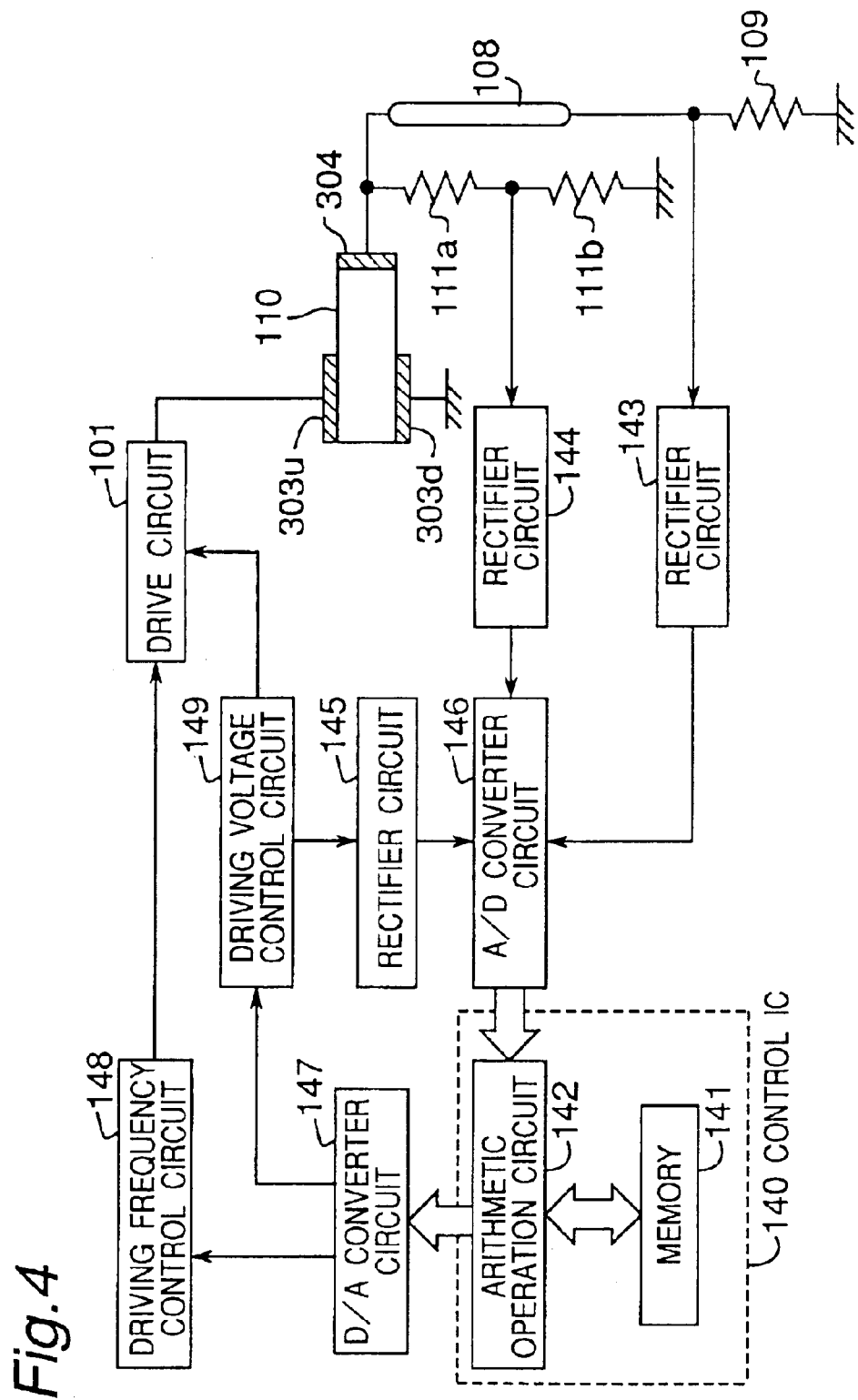
FIG. 4 is a block diagram of the second embodiment of the piezoelectric transformer driving circuit according to the present invention.

FIG. 4 is a diagram showing the second embodiment of the circuit for driving a piezoelectric transformer according to the present invention. This embodiment is different from the first embodiment in that the control is carried out by a digital processing. In the circuit of this embodiment, the current detector circuit 107, the oscillation control circuit 106, the step-up ratio detector circuit 105, and the pulse width control circuit 104 are replaced by a rectifier circuit 144, an A/D converter circuit 146, a control circuit 140, an D/A converter circuit 147, and a driving frequency control circuit 148. The driving frequency control circuit 148 corresponds to the oscillation control circuit 106 shown in FIG. 1. A driving voltage control circuit 149 corresponds to a combination of the pulse width control circuit 104 and the DC—DC converter 102 shown in FIG. 1. The control circuit 140 comprises a memory 141 for storing software such as data and programs, and an arithmetic operation circuit 142 for executing the programs stored in the memory 141 to perform the predetermined process. The control circuit 140 may be implemented by a semiconductor integrated circuit. The basic function of the circuit shown in FIG. 4 is substantially identical to that of circuit shown in FIG. 1. Therefore, the action of the control circuit 140 will particularly be described in more detail referring to the flowchart shown in FIG. 5.

Figure 5:
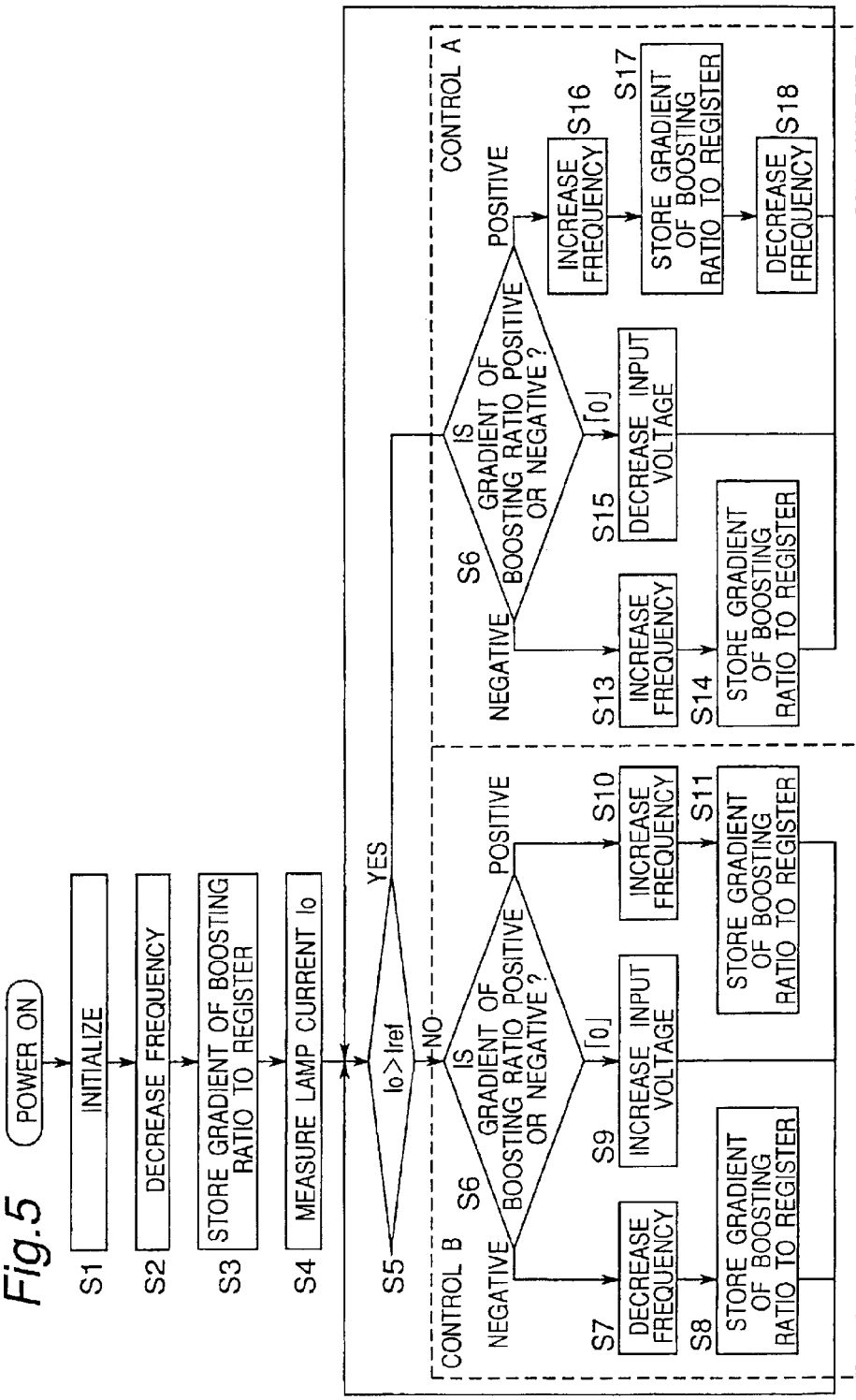
FIG. 5 is a flowchart showing the action of a control circuit in the driving circuit of the second embodiment.

FIG. 5 is the flowchart illustrating a procedure of steps of the control circuit 140 in the piezoelectric transformer driving circuit of this embodiment.

On energizing the driving circuit, the data (the gradient of the step-up ratio) stored in the memory 141 of the control circuit 140 are reset, and the settings of the driving frequency and the driving voltage are initialized (S1). The output of the control circuit 140 is converted to an analog signal by the D/A converter circuit 147 and transferred to the driving frequency control circuit 148 and the driving voltage control circuit 149. According to the driving frequency and the driving voltage from the circuits 148 and 149, the piezoelectric transformer 110 outputs a desired level of high voltage from the secondary electrode 304. The output voltage from the piezoelectric transformer 110 and the lamp current are rectified by the rectifier circuits 143 and 144 respectively, converted into digital signals by the A/D converter circuit 146, and fed to the control circuit 140. For producing an input voltage to the piezoelectric transformer 110, the output of the driving voltage control circuit 149 is rectified by the rectifier circuit 145, A/D-converted by the A/D converter circuit 146, and transferred to the control circuit 140. The driving frequency is then shifted by one step to the lower side (S2). This results in a change of the step-up ratio. The gradient of the step-up ratio to the frequency is stored to a register (S3).

Then the lamp current Io is read (S4), and the read lamp current Io is compared with the current setting level Iref (S5). From a comparison result, when the lamp current Io is greater than the current setting level Iref, the routine "control A" shown in FIG. 5 is executed. In the "control A" routine, the gradient of the step-up ratio is first examined (S12). When the gradient is positive (i.e. the resonant frequency of the piezoelectric transformer 110 is greater than the driving frequency), the driving frequency is raised (S16) and the gradient of the step-up ratio is stored to the register (S17). Then, the input voltage is fallen (S18). When the gradient is negative (i.e. the resonant frequency is smaller than the driving frequency), the driving frequency is raised (S13) and the gradient of the step-up ratio is stored to the register (S14). When the gradient of the step-up ratio is zero, i.e. the resonant frequency is equal to the driving frequency of the piezoelectric transformer, the input voltage is fallen (S15).

Figure 6:
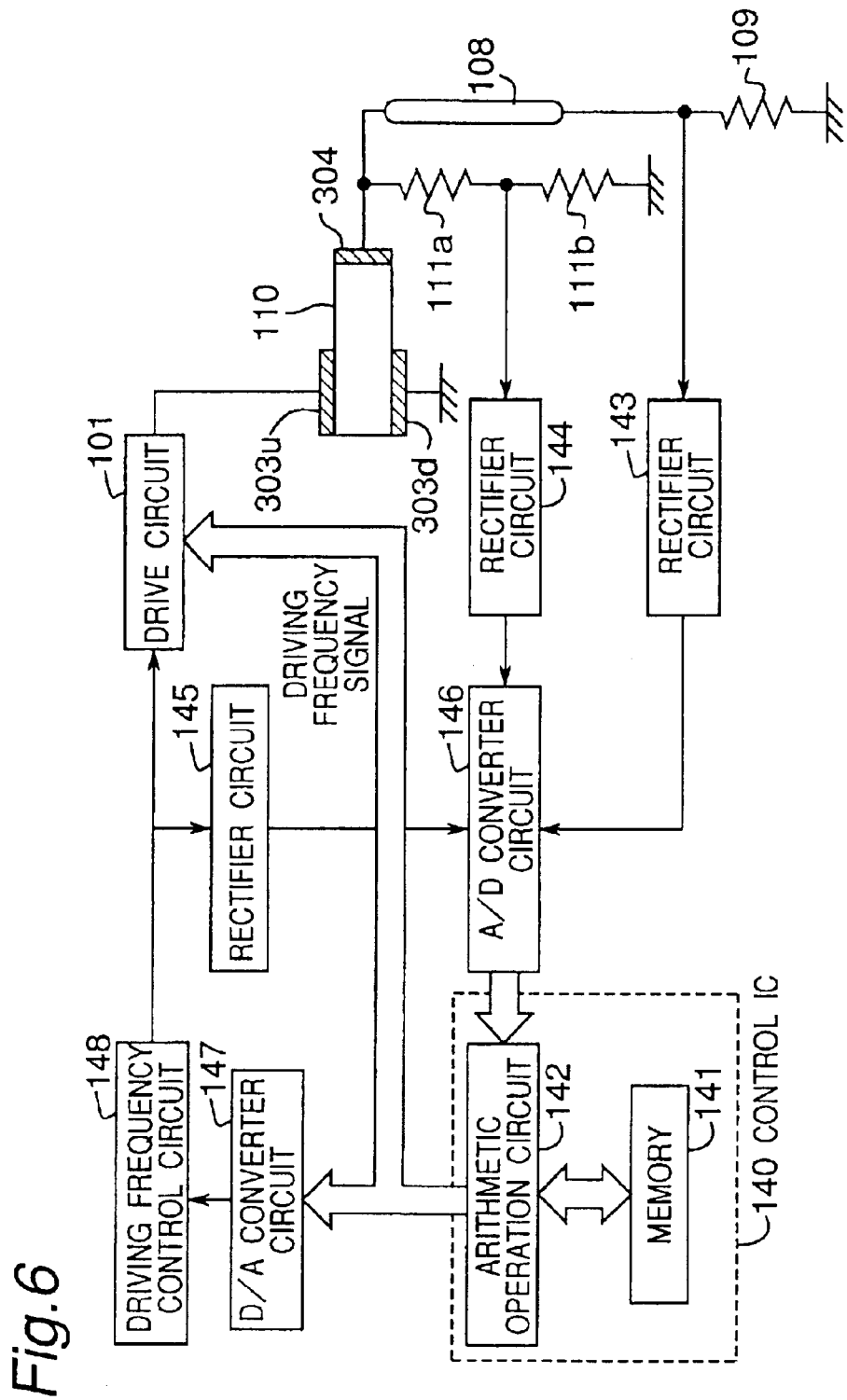
FIG. 6 is a block diagram of the third embodiment of the piezoelectric transformer driving circuit according to the present invention.

When it is judged that the lamp current is smaller than the current setting level, the routine of "control B" shown in FIG. 6 is executed. In the "control B" routine, when the gradient is positive (i.e. the resonant frequency is greater than the driving frequency for the piezoelectric transformer), the driving frequency is raised (S10) and the gradient of the step-up ratio is stored to the register (S11). When the gradient is negative (i.e. the resonant frequency is smaller than the driving frequency), the driving frequency is fallen (S7) and the gradient of the step-up ratio is stored to the register (S8). When the gradient of the step-up ratio is zero, i.e. the resonant frequency is equal to the driving frequency of the piezoelectric transformer, the input voltage is fallen (S9).

The piezoelectric transformer 110 can be controlled by the above described controlling process even when the driving frequency of the piezoelectric transformer exceeds the resonant frequency of the piezoelectric transformer.

In this embodiment, a range of the driving frequency is not limited. A range of the driving frequency may be limited such that the operating efficiency of the piezoelectric transformer can be improved, thus to provide a power source circuit having a high efficiency.

As shown in FIG. 6, the function of the driving frequency control circuit 148 may be installed in a control circuit 151 implemented by an control IC. This allows the circuit to be minimized in the overall dimensions. The basic action in the controller IC 151 is substantially identical to that described above.

In this embodiment, the driving frequency is shifted by a step with a constant step width. It is preferable to vary the step width so that the step width is narrower when the driving frequency is close to the resonant frequency of the piezoelectric transformer, or the width is broader when the driving frequency is far from the resonant frequency. This will contribute to the higher operational reliability of the power source circuit.

Third Embodiment

Figure 7:
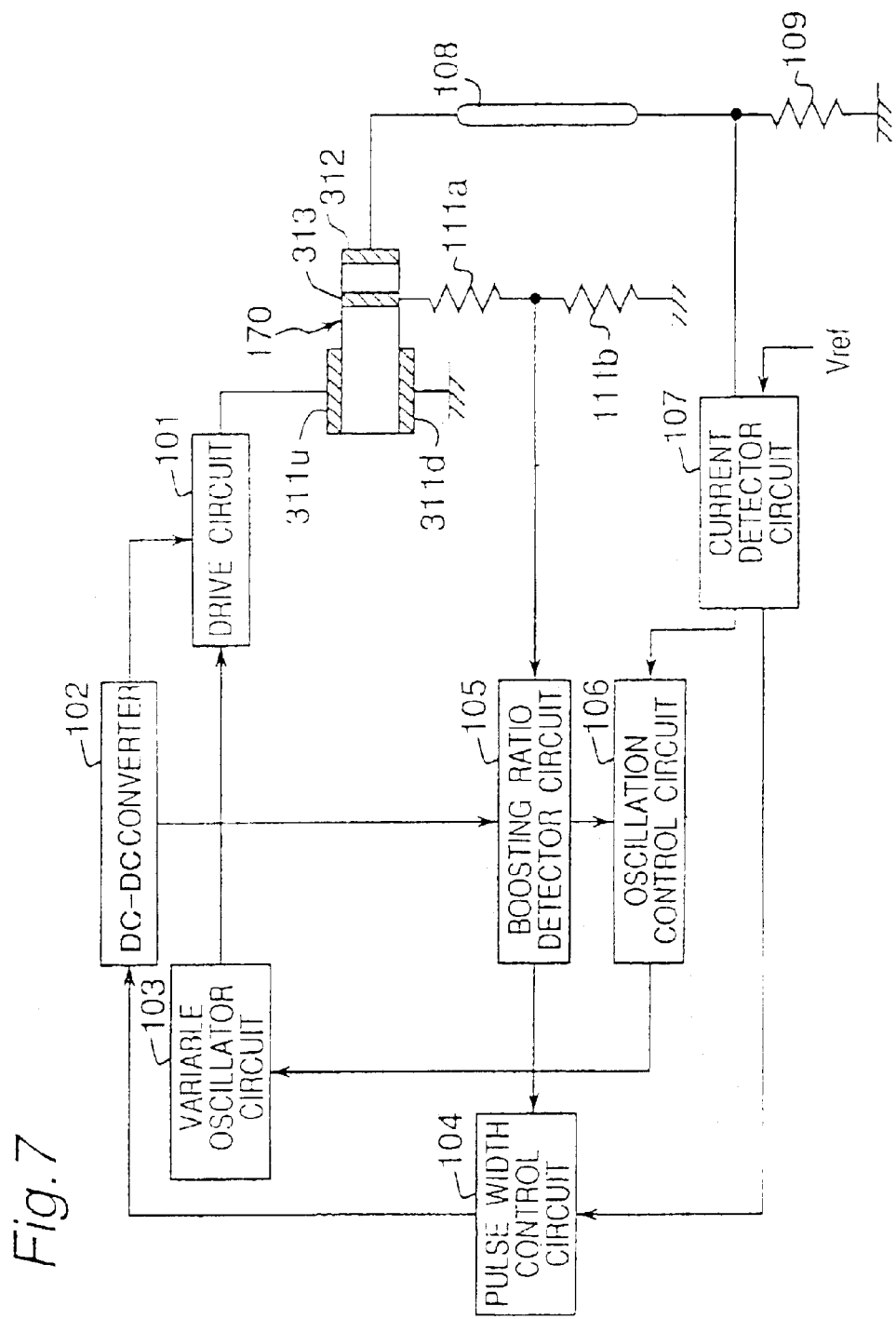
FIG. 7 is a block diagram showing a modification of the piezoelectric transformer driving circuit of the third embodiment.

FIG. 7 is a block diagram of a driving circuit of the piezoelectric transformer of the third embodiment according to the present invention. This embodiment is different from the first embodiment in that the piezoelectric transformer 170 of this embodiment is provided with a third electrode 313 in addition to the primary electrodes 311u and 311d and the secondary electrode 312. As the piezoelectric transformer 170 with the third electrode is used for control, no high-voltage wiring pattern is needed on the circuit substrate. Accordingly, the driving circuit will be minimized in the overall dimensions without considering the spatial distance or the surface distance for safety design.

Figure 8:
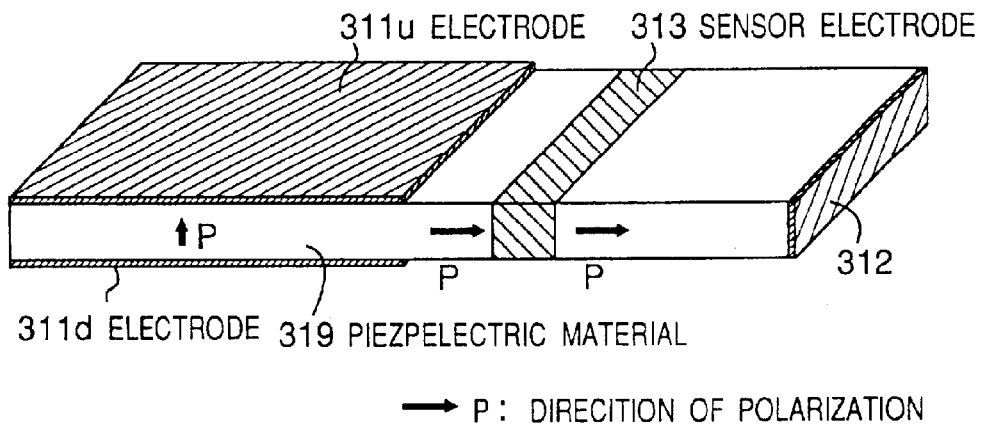
FIG. 8 is a perspective view of a piezoelectric transformer provided with a third electrode.

FIG. 8 illustrates a structure of the piezoelectric transformer in this embodiment. The piezoelectric transformer includes the third electrode (sensor electrode) 313 in addition to the primary electrodes 311u and 311d and the secondary electrode 312. The secondary electrode 312 is located on a face of the piezoelectric transformer. The opposite electrode to the secondary electrode or the third electrode is common to the primary electrode 311d. The piezoelectric transformer in this embodiment is made of a piezoelectric material such as PZT having piezoelectric characteristics. Voltage applied to the primary electrodes 311u and 311d is raised or multiplied by the step-up ratio, and then retrieved from the secondary electrode 312.

Figure 9:
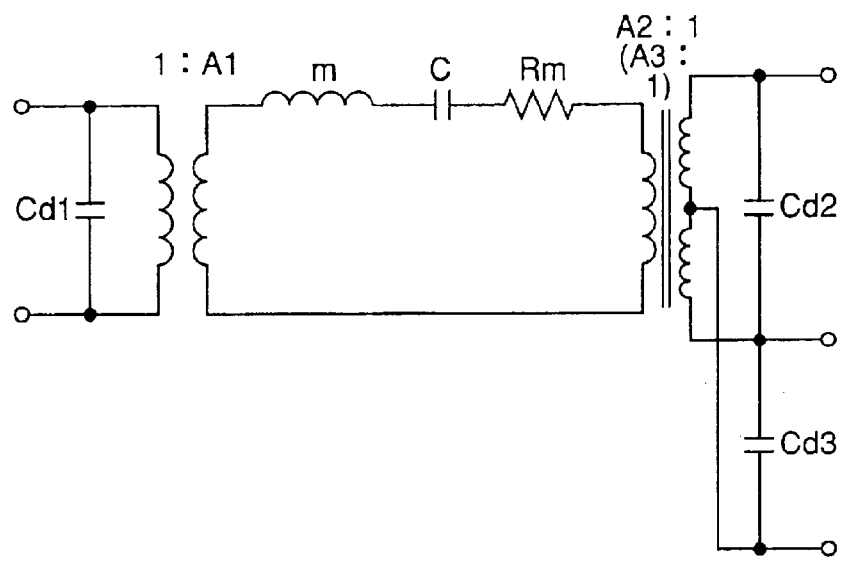
FIG. 9 is a diagram of an equivalent circuit showing the piezoelectric transformer provided with a third electrode.

The action of the piezoelectric transformer 170 having the above described structure will now be described. FIG. 9 illustrates a concentrated constant approximation equivalent circuit at a frequency close to the resonance frequency of the piezoelectric transformer. As shown in FIG. 9, the equivalent circuit is expressed by two clamped capacitance Cd1 and Cd2 at the input side and the output side respectively, a clamped capacitance Cd3 of a sensor section, an input side force factor A1, an output side force factor A2, and a force factor A3 of the sensor section, an equivalent mass m, an equivalent compliance C, and an equivalent mechanical resistance Rm. In the piezoelectric transformer 170 in this embodiment, the force factor A1 is greater than force factor A2 (A3) and stepped up by a pair of ideally equivalent transformers shown in FIG. 9. Since the piezoelectric transformer 170 includes a series resonance circuit having the equivalent mass and the equivalent compliance, the output voltage of the transformer is of a level greater than the level obtained by a transforming ratio especially when the load resistance is great.

The driving circuit of the embodiment using the piezoelectric transformer will be explained referring to FIG. 7.

As shown in FIG. 7, the variable oscillator circuit 101 generates an alternating current drive signal for driving the piezoelectric transformer 170. The output of the variable oscillator circuit 103 is amplified by the drive circuit 101 to a voltage level enough to drive the piezoelectric transformer 170 and then fed to the primary electrode of the piezoelectric transformer 170. An output voltage stepped up by the piezoelectric effect of the piezoelectric transformer 170 is retrieved from the secondary electrode 312.

The high voltage output from the secondary electrode 312 is applied to a series circuit composed of the cold cathode lump 108 and the feedback resistor 109. The third electrode 313 of the piezoelectric transformer 170 is connected to the voltage dividing resistors 111a and 111b. The step-up ratio detector circuit 105 compares the voltage across the voltage dividing resistor 111b with a voltage input to the drive circuit 101 to determine a ratio between the voltage output from the secondary electrode 312 of the piezoelectric transformer 170 and the voltage input to the drive circuit 101 and also measure a gradient of the voltage ratio.

The voltage across the feedback resistor 109 is applied to the current detector circuit 107. The current detector circuit 107 generates a detection signal indicative of the voltage across the feedback resistor 109 with reference to a reference voltage Vref, and then feeds the detection signal to the oscillation control circuit 106 and the pulse width control circuit 104.

The oscillation control circuit 106 and the pulse width control circuit 104 perform a predetermined control based on outputs from the step-up ratio detector circuit 105 and the current detector circuit 107 so that the current across the cold cathode lump 108 is constant.

Control of the driving frequency and the input voltage by the current detector circuit 107 and the step-up ratio detector circuit 105 in the driving circuit with the configuration described above will be explained with reference to FIGS. 10A and 10B.

Figure 10A:
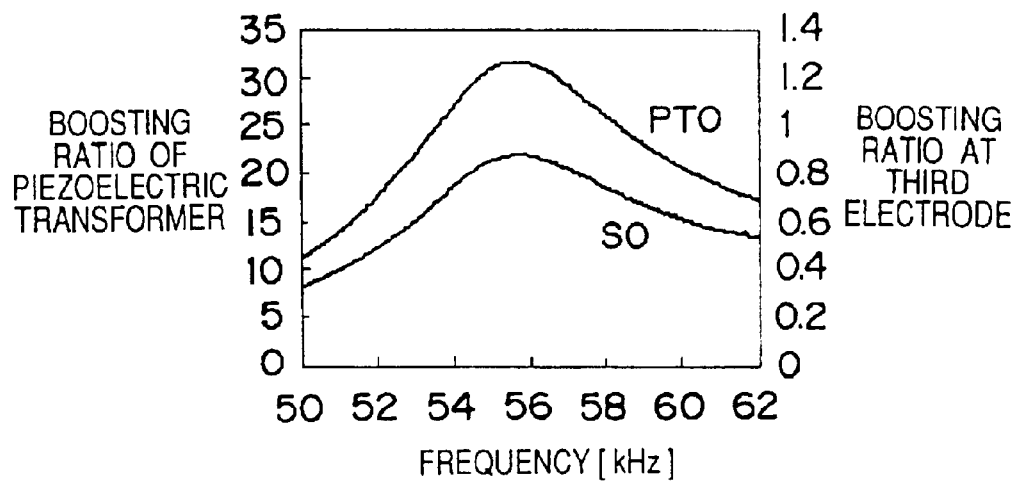
FIG. 10A is a diagram showing a frequency response of a step-up ratio in the piezoelectric transformer provided with the third electrode.
Figure 10B:
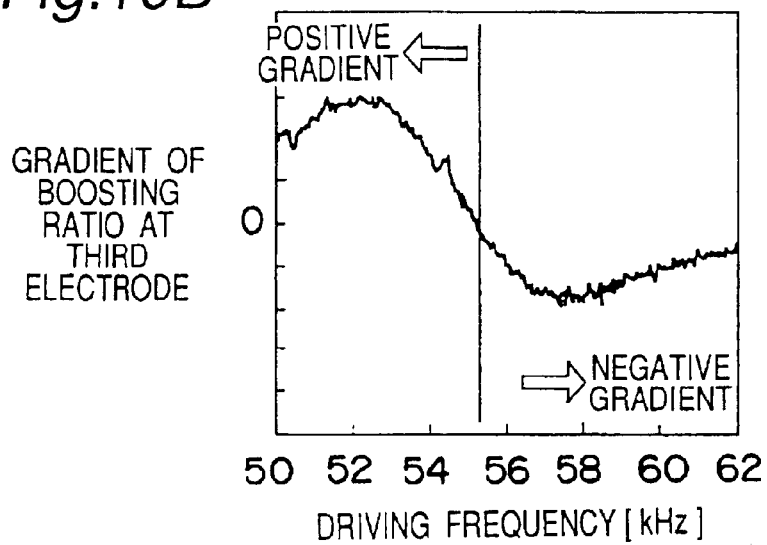
FIG. 10B is a diagram showing a frequency response of a gradient of the step-up ratio.

FIGS. 10A and 10B illustrate characteristics of an operation of the piezoelectric transformer. FIG. 10A shows a relation between the frequency which is represented along the horizontal axis, and the step-up ratios (PTO and SO) at the secondary electrode and at the third electrode 313 with the cold cathode lump 108 of the piezoelectric transformer 170 being lit up which are represented along the vertical axis, respectively. Also, FIG. 10B indicates a relation between the frequency shown along the horizontal axis and the gradient of the step-up ratio at the third electrode 313 shown along the vertical axis. As shown in FIG. 10A, the frequency at the maximum of the step-up ratio of the secondary electrode 312 matches that of the third electrode 313. The level of the output (with the step-up ratio SO) from the third electrode 313 is much smaller than that (with the step-up ratio PTO) from the secondary electrode 312 of the piezoelectric transformer 170. It is then apparent that the control with detection of the output voltage from the third electrode 313 can reduce wiring for high-voltage and the circuit size.

In case that the current across the cold cathode lump 108 is smaller than the current setting level in the circuit shown in FIG. 7, the lamp current has to be increased. For increasing the lamp current, the driving frequency of the piezoelectric transformer 170 may be controlled so as to approach to the resonant frequency to drive in a range with a higher level of the step-up ratio, or the input voltage to the piezoelectric transformer 170 may be increased to raise the output voltage.

When the current across the cold cathode lump 108 (the voltage across the feedback resistor) measured by the current detector circuit 107 is smaller than the current setting level (equivalent to Vref) and also the gradient of the step-up ratio measured by the step-up ratio detector circuit 105 is negative, the relation between the resonant frequency and the driving frequency shown in FIG. 10B is expressed by (Resonant frequency)<(Driving frequency).

Accordingly, the driving frequency approaches to the resonant frequency until the lamp current reaches the current setting level. When the gradient of the step-up ratio is turned to zero (at the maximum of the step-up ratio of the piezoelectric transformer) and the lamp current is smaller than the current setting level, the sweep of the driving frequency by the oscillation control circuit 106 is stopped. Then the pulse width control circuit 104 performs a voltage control so that the input voltage to the piezoelectric transformer 170 increases.

When the gradient of the step-up ratio is positive, the relation between the resonant frequency and the driving frequency shown FIG. 10(b) is expressed by (Resonant frequency)>(Driving frequency).

Accordingly, the driving frequency is increased to approach to the resonant frequency. When the gradient of the step-up ratio is turned to zero (at the maximum of the step-up ratio of the piezoelectric transformer) and the lamp current is smaller than the current setting level, the sweep of the driving frequency by the oscillation control circuit 106 is stopped. The pulse width control circuit 104 controls the input voltage to the piezoelectric transformer 170 to increase.

Alternatively, in case that the current across the cold cathode lump 108 is greater than the current setting level, the lamp current has to be decreased. For decreasing the lamp current, the driving frequency of the piezoelectric transformer 170 may be kept away from the resonant frequency to drive in a range with a lower level of the step-up ratio, or the input voltage to the piezoelectric transformer 170 may be decreased to lower the output voltage.

When the current across the cold cathode lump 108 (the voltage across the feedback resistor) measured by the current detector circuit 107 is greater than the current setting level (equivalent to Vref) and also the gradient of the step-up ratio measured by the step-up ratio detector circuit 105 is negative, the relation between the resonant frequency and the driving frequency is expressed, with reference to FIG. 10B, by (Resonant frequency)<(Driving frequency).

Accordingly, the pulse width control circuit 104 performs a control to decrease the input voltage to the piezoelectric transformer 170. This allows the piezoelectric transformer 170 to be driven at a favorable frequency close to the resonant frequency which provides a higher level of the conversion efficiency. When the input voltage to the piezoelectric transformer 170 reaches the minimum limit of the range, the driving frequency is shifted to the higher side until the lamp current becomes the current setting level.

When the gradient of the step-up ratio is positive, the relation between the resonant frequency and the driving frequency shown in FIG. 10B is expressed by (Resonant frequency)>(Driving frequency).

Accordingly, to drive the piezoelectric transformer 170, the driving frequency of the piezoelectric transformer 170 is increased to approach to the resonant frequency. This may cause the step-up ratio to rise up temporarily thus increasing the lamp current. The control is designed not to drive at a frequency range that is lower than the resonant frequency at which non-linear effects develops. When the gradient of the step-up ratio is turned to zero (at the maximum of the step-up ratio of the piezoelectric transformer) and the lamp current is greater than the current setting level, the sweep of the driving frequency by the oscillation control circuit 106 is stopped. The pulse width control circuit 104 performs a voltage control so as to decrease the input voltage to the piezoelectric transformer 170.

In this embodiment, the driving frequency is inhibited from falling in a range of frequencies lower than the resonant frequency as much as it can. If the piezoelectric transformer 170 can be driven in a linear range within a predetermined power range, it may be controlled by keeping the driving frequency at a distance from the resonant frequency.

While a frequency range of the driving frequency is not provided in this embodiment, a frequency range may be defined so that the driving frequency is not distant too far from the resonance frequency since the piezoelectric transformer 170 can be driven efficiently at around the resonant frequency. In this case, as the piezoelectric transformer can be driven at a higher efficiency, the operational reliability of the piezoelectric transformer 170 can be improved and an inverter circuit with high efficiency can be implemented.

In this embodiment, the piezoelectric transformer 170 is controlled depending on the gradient of the step-up ratio, and therefore the control is performed regardless of whether the driving frequency is higher or lower than the resonant frequency. However, as to the piezoelectric transformer made of a piezoelectric ceramic, since the piezoelectric transformer may operate unstable at the driving frequency smaller than the resonant frequency due to the non-linear properties of the piezoelectric transformer, it is preferable to control in a range where the gradient of the step-up ratio is negative. In that case, the driving frequency is controlled so as not to close to the resonant frequency within a predetermined distance, and the input voltage is modified when the driving frequency reaches the minimum limit of the range. Thus, the above described method comprises setting a driving frequency range in advance, and controlling the driving frequency when the driving frequency stays within the range or controlling the input voltage when the driving frequency reaches the minimum limit of the range, resulting in the piezoelectric transformer 170 capable of being stably driven.

In this embodiment, the sweep of the driving frequency of the piezoelectric transformer is executed regardless of a change in the gradient of the step-up ratio. As to drive of the piezoelectric transformer at around the resonant frequency, when the driving frequency is modified to reduce a change in the mechanical vibration, the driving frequency may preferably be modified by smaller steps (smaller modifying rate) as the driving frequency becomes distant far from the resonant frequency. This control of the driving frequency can drive the piezoelectric transformer with high reliability even though the piezoelectric transformer is driven with a frequency close to the resonant frequency.

In this embodiment, a structure of the piezoelectric transformer with the third electrode is one shown in FIG. 8. If the third electrode is arranged to output an output voltage smaller than that of the secondary electrode, another structure may be employed (this is applicable to the other embodiments).

While the control in this embodiment is performed in an analog mode, it may be performed in a digital mode like the second embodiment.

Fourth Embodiment

Figure 11:
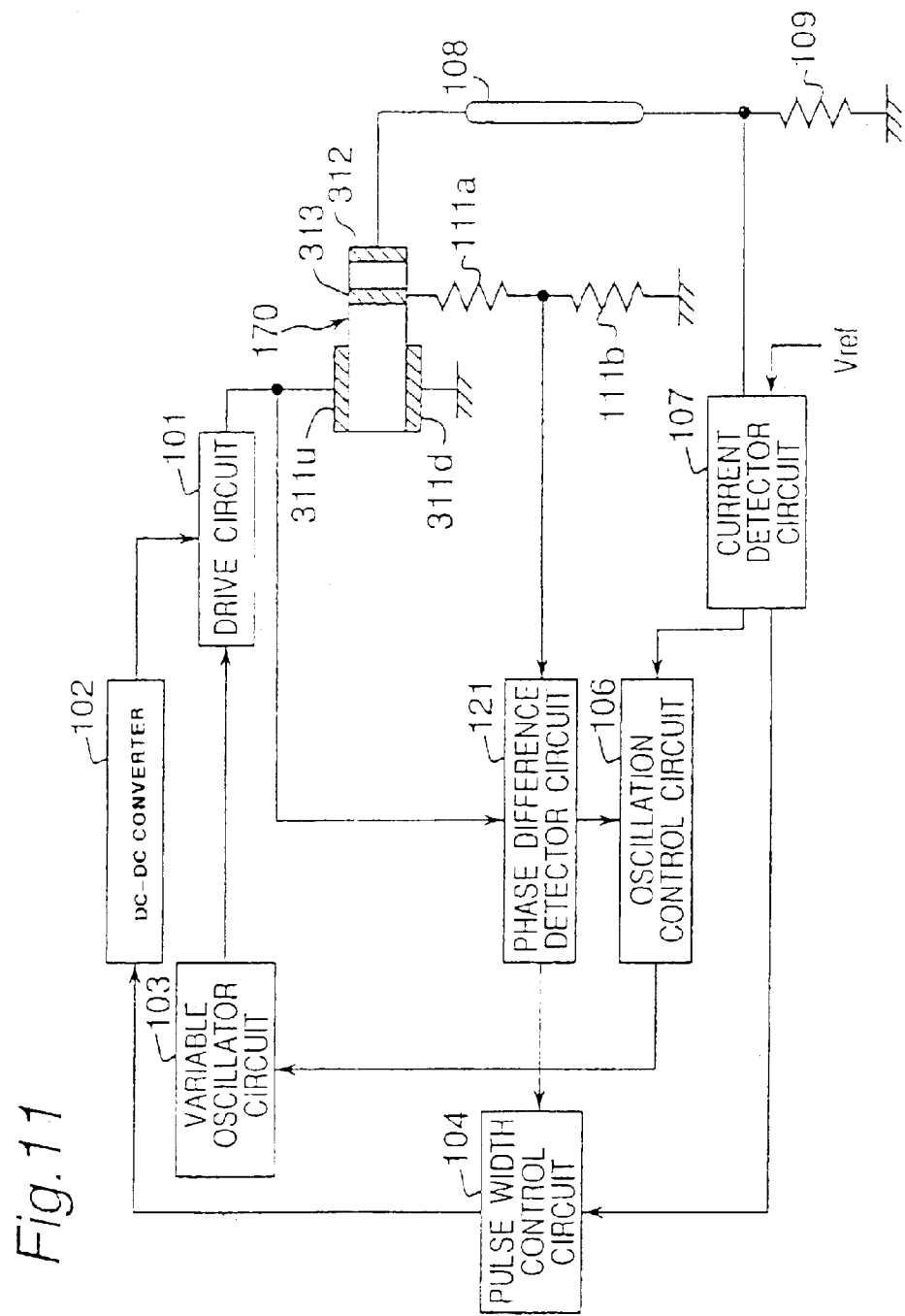
FIG. 11 is a block diagram of the fourth embodiment of the piezoelectric transformer driving circuit according to the present invention.

FIG. 11 is a block diagram of the piezoelectric transformer driving circuit of the fourth embodiment according to the present invention. The structure of a piezoelectric transformer in this circuit includes a third electrode as is identical to that of the third embodiment.

This embodiment of the driving circuit is differentiated from the third embodiment in that the control is based on a phase difference between the output voltage of the third electrode 313 and the input voltage of the piezoelectric transformer 170.

The driving circuit of this embodiment will be described in more detail with reference to FIG. 11.

As shown in FIG. 11, a variable oscillator circuit 103 generates an alternating current drive signal for driving the piezoelectric transformer 170. The output signal of the variable oscillator circuit 103 is then amplified by a drive circuit 101 to a voltage level enough to drive the piezoelectric transformer 170 and transferred to primary electrodes 311u and 311d of the piezoelectric transformer 170. The output voltage of the piezoelectric transformer 170 stepped up by the piezoelectric effect thereof is output from a secondary electrode 312.

The stepped up output voltage from the secondary electrode 312 is applied to a series circuit composed of a cold cathode lump 108 and a feedback resistor 109. A couple of voltage dividing resistors 111a and 111b are connected to the third electrode 313 of the piezoelectric transformer 170. A phase difference detector circuit 121 compares the voltage across the voltage dividing resistor 111b with the voltage fed into the drive circuit 101 to determine a phase difference between the voltage output from the third electrode 313 of the piezoelectric transformer 170 and the voltage fed into the drive circuit 101.

The voltage across the feedback resistor 109 is applied to a current detector circuit 107. The current detector circuit 107 in turn supplies an oscillation control circuit 106 and a pulse width control circuit 104 with a signal for making the current across the cold cathode lump 108 uniform.

In response to the two outputs of the phase difference detector circuit 121 and the current detector circuit 107, the oscillation control circuit 106 and the pulse width control circuit 104 performs a control so that the current across the cold cathode lump 108 can be uniform.

Figure 12A:
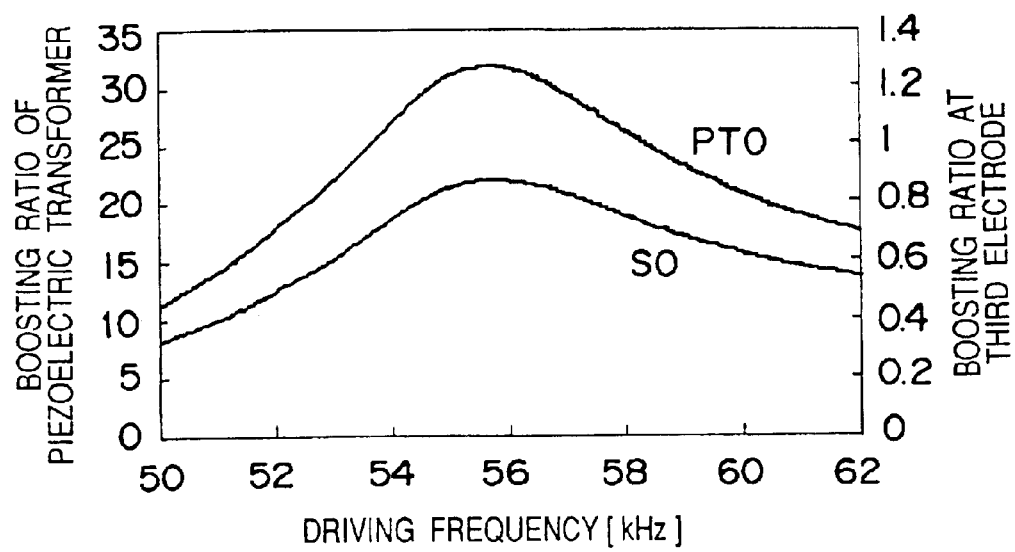
FIG. 12A is a diagram showing a frequency response of a step-up ratio in a piezoelectric transformer provided with the third electrode.
Figure 12B:
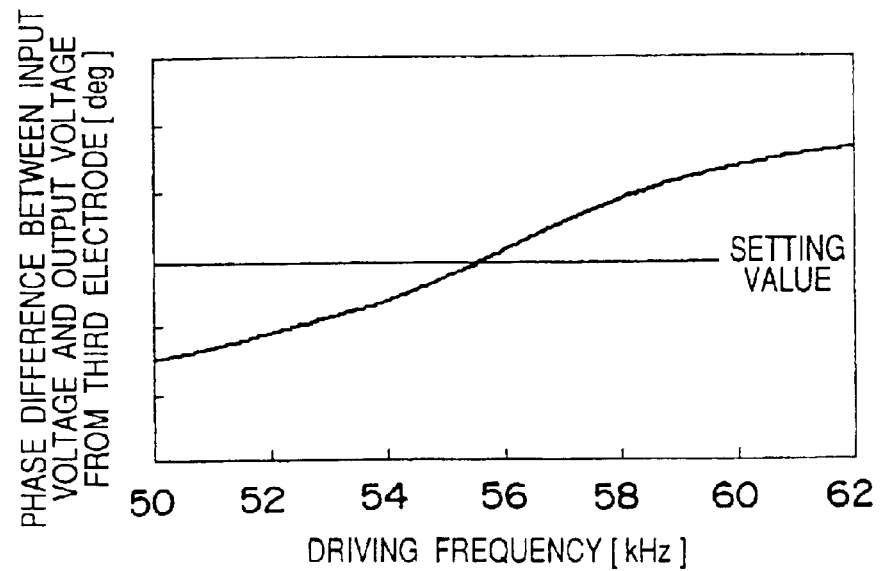
FIG. 12B is a diagram showing a frequency response of a phase difference between the input voltage and the output voltage from the third electrode.

Control of the driving frequency and the input voltage according to the current detector circuit 107 and the phase difference detector circuit 121 in the piezoelectric transformer driving circuit of this embodiment will be explained with reference to FIGS. 12A and 12B. FIGS. 12A and 12B illustrate diagrams of characteristic curves of the piezoelectric transformer. FIG. 12A shows the relation between the frequency along the horizontal axis and the step-up ratios (PTO and SO) at the secondary electrode 312 and the third electrode 313 respectively along the vertical axis with the cold cathode lump 108 being lit up. FIG. 12B indicates the relation between the frequency along the horizontal axis and the phase difference between the voltage input and the voltage output of the third electrode 313 along the vertical axis. As shown in FIG. 12A, the frequency at the maximum of the step-up ratio of the secondary electrode 312 is identical to the frequency at the maximum of the step-up ratio of the third electrode 313. Thus it is understood that the voltage output of the third electrode 313 can be used for the control.

In case that the current across the cold cathode lump 108 is smaller than the current setting level in the circuit shown in FIG. 11, the lamp current can be increased by approximating the driving frequency of the piezoelectric transformer 170 to the resonant frequency to drive at a higher level of the step-up ratio or by increasing the input voltage to the piezoelectric transformer 170 to elevate the output voltage.

When the current across the cold cathode lump 108 measured by the current detector circuit 107 is smaller than a current setting level and also the phase difference measured by the phase difference detector circuit 121 is greater than a phase setting level, the relation between the resonant frequency and the driving frequency is expressed, with reference to FIG. 12B, by (Resonant frequency)<(Driving frequency).

Accordingly, the driving frequency is changed to approach to the resonant frequency until the lamp current reaches the current setting level. When the phase difference is equal to the phase setting level (corresponding to the maximum of the step-up ratio of the piezoelectric transformer 170) and the lamp current is smaller than the current setting level, the sweep of the driving frequency by the oscillation control circuit 106 is stopped. The pulse width control circuit 104 performs a voltage control to increase the input voltage to the piezoelectric transformer 170.

When the phase difference is smaller than the phase setting level, the relation between the resonant frequency and the driving frequency is expressed by (Resonant frequency)>(Driving frequency).

Accordingly, the driving frequency is increased to approach to the resonant frequency. When the phase difference is equal to the phase setting level (at the maximum of the step-up ratio of the piezoelectric transformer 170) and the lamp current is smaller than the current setting level, the sweep of the driving frequency by the oscillation control circuit 106 is canceled. The pulse width control circuit 104 then performs a control for increasing the input voltage to the piezoelectric transformer 170.

Alternatively, in case that the current across the cold cathode lump 108 is greater than the current setting level, it is possible to decrease the lamp current by distancing the driving frequency of the piezoelectric transformer 170 from the resonant frequency to drive at a lower level of the step-up ratio or by decreasing the input voltage to the piezoelectric transformer 170 to lower the output voltage. When the current across the cold cathode lump 108 measured by the current detector circuit 107 is greater than the current setting level and also the phase difference measured by the phase difference detector circuit 121 is greater than the phase setting level, the relation between the resonant frequency and the driving frequency is expressed by (Resonant frequency)<(Driving frequency).

Accordingly, the pulse width control circuit 104 performs a voltage control for decreasing the input voltage to the piezoelectric transformer 170. This allows the piezoelectric transformer 170 to be driven at a favorable frequency close to the resonant frequency which provides a higher level of the conversion efficiency. When the input voltage to the piezoelectric transformer 170 reaches the minimum of the range, the driving frequency is shifted to the higher side until the lamp current becomes the current setting level.

When the phase difference is smaller than the phase setting level, the relation between the resonant frequency and the driving frequency is expressed by (Resonant frequency)>(Driving frequency).

Accordingly, the driving frequency of the piezoelectric transformer 170 is increased to approach to the resonant frequency so that the piezoelectric transformer 170 is driven at the higher frequency than the resonant frequency. This may cause the step-up ratio to rise up temporarily thus increasing the lamp current. However in this embodiment the control is done so that the drive is not performed in a frequency range lower than the resonant frequency which may develop non-linear effects. When the phase difference is equal to the phase setting level (at the maximum of the step-up ratio of the piezoelectric transformer 170) and the lamp current is greater than the current setting level, the sweep of the driving frequency by the oscillation control circuit 106 is stopped and then the pulse width control circuit 104 controls a voltage control for decreasing the input voltage to the piezoelectric transformer 170.

In this embodiment, the driving frequency is controlled so as not to fall in a range of frequencies lower than the resonant frequency as much as it can. If the piezoelectric transformer 170 is successfully driven in a linear range within an available power range, it may be controlled by distancing the driving frequency from the resonant frequency.

While the driving frequency is not limited to a particular range in this embodiment, the driving frequency range may be defined so that the driving frequency does not distance far from the resonance frequency at which the piezoelectric transformer 170 can be driven efficiently. In that case as the piezoelectric transformer 170 can be driven at a higher efficiency, it is possible to improve the operational reliability of the piezoelectric transformer 170 and provide the inverter circuit with high efficiency.

In this embodiment, the piezoelectric transformer 170 is controlled based on the detected phase difference, regardless of examining whether the driving frequency is higher or lower than the resonant frequency. In case that the piezoelectric transformer is made of a piezoelectric ceramic, the action of the transformer may be unstable due to the non-linear properties when the driving frequency is smaller than the resonant frequency. It is hence preferable to control in a range in which the phase difference remains greater than the phase setting level. In that case, the driving frequency is defined in a specific range so as not to approach to the resonant frequency beyond a predetermined setting value. When the driving frequency reaches the minimum of the range, the input voltage is modified. As described above, the range of the driving frequency is provided in advance. The frequency is controlled when the driving frequency stays in the range, while the input voltage is controlled when the driving frequency reaches the maximum or minimum limit of the range. Thus, the piezoelectric transformer 170 can be controlled stably.

In this embodiment, the sweep of the driving frequency of the piezoelectric transformer 170 is executed regardless of a rate of change in the phase difference. It is, however, preferable to modify the sweeping speed of the driving frequency in response to the phase difference of the piezoelectric transformer which is varied depending on the frequency. That is, when the driving frequency close to the resonant frequency is used to drive the piezoelectric transformer 170, it may preferably be modified with the rate of modification (sweep speed) which is arranged smaller than when the driving frequency is distant from the resonant frequency. Such a frequency control allows the piezoelectric transformer 170 to be driven with high reliability even though the transformer is driven at a frequency close to the resonant frequency.

While the control shown in this embodiment is performed in an analog mode, it may be performed in a digital mode like the second embodiment.

Fifth Embodiment

Figure 13:
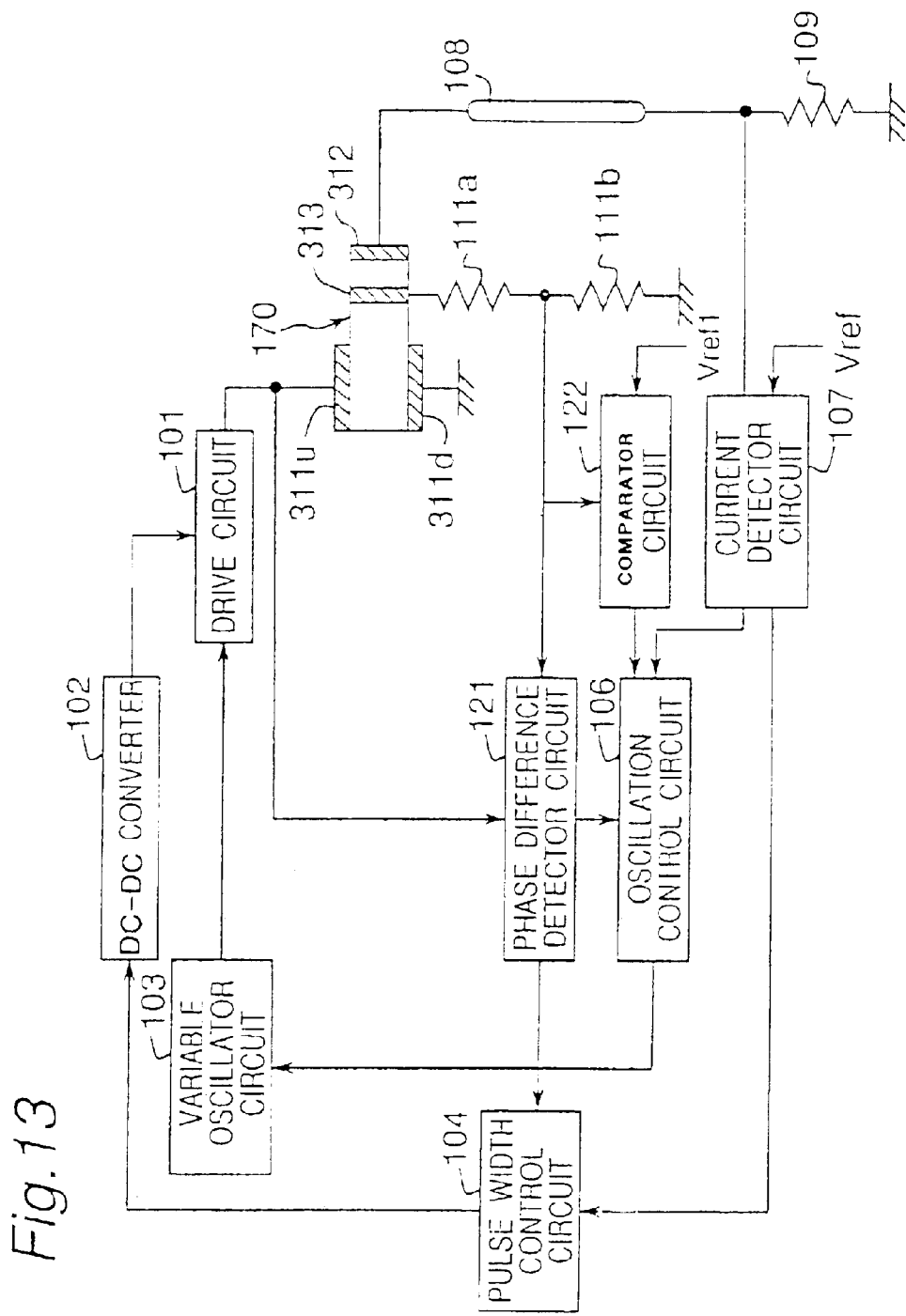
FIG. 13 is a block diagram of the fifth embodiment of the piezoelectric transformer driving circuit according to the present invention.

FIG. 13 is a block diagram of the piezoelectric transformer driving circuit of the fifth embodiment according to the present invention. The construction of the piezoelectric transformer in this embodiment is identical to that of the third or fourth embodiment.

The driving circuit in this embodiment is different from the fourth embodiment in that the voltage output of the third electrode 313 is used for overvoltage protection of the piezoelectric transformer 170.

The driving circuit of this embodiment will be described in more detail with reference to FIG. 13.

As shown in FIG. 13, a variable oscillator circuit 103 generates an alternating current drive signal for driving the piezoelectric transformer 110. The output of the variable oscillator circuit 103 is amplified by a drive circuit 101 to a voltage level enough to drive the piezoelectric transformer 170 and transferred to primary electrodes of the piezoelectric transformer 170. The output voltage of the piezoelectric transformer 170 stepped up by the piezoelectric effect thereof is output from a secondary electrode thereof.

The high voltage output from the secondary electrode 312 of the piezoelectric transformer 170 is applied to a series circuit composed of a cold cathode lump 108 and a feedback resistor 109. Voltage dividing resistors 111a and 111b are connected in parallel with a third electrode 313 of the piezoelectric transformer 170. A phase difference detector circuit 121 compares the voltage across the voltage dividing resistor 111b with the voltage received by the drive circuit 101 to determine a phase difference between the voltage output of the third electrode 313 of the piezoelectric transformer 170 and the input voltage of the drive circuit 101. The voltage generated across the voltage dividing resistor 111b is transferred to a comparator circuit 122 for overvoltage protection on the lighting-up of the code cathode lump 108.

The voltage across the feedback resistor 109 is transferred to a current detector circuit 107 which in turn supplies an oscillation control circuit 106 and a pulse width control circuit 104 with a signal for making the current across the cold cathode lump 108 uniform.

At the start-up of lighting, the current detector circuit 107 is stopped, and the pulse width control circuit 104 applies a setting level of voltage to the piezoelectric transformer 170. The oscillation control circuit 106 receives an output of the comparator circuit 122. The comparator circuit 122 compares the output of the third electrode 313 of the piezoelectric transformer 170 with the voltage setting level Vref1 to produce a signal indicative of the result of comparison and transferred to the oscillation control circuit 106. The oscillation control circuit 106, according to the signal from the comparator circuit, when finding that the output voltage of the third electrode 313 is smaller than the voltage setting level, outputs a control signal to the variable oscillator circuit 103 so as to approach the driving frequency to the resonant frequency. When the output voltage of the third electrode 313 of the piezoelectric transformer 170 becomes equal to the voltage setting level, the oscillator control circuit 106 supplies the variable oscillator circuit 103 with a control signal for terminating the sweep of the driving frequency to stop the increase of the applied voltage. When the cold cathode lump 108 is lit up, the comparator circuit 221 stops its action. Then, according to the output from the current detector circuit 107 and the output from the phase difference detector circuit 121, the oscillation control circuit 106 and the pulse width control circuit 104 are controlled so that the current across the cold cathode lump 108 becomes constant.

The action of the driving circuit at the start-up of lighting will be explained with reference to FIGS. 14A and 14B.

Figure 14A:
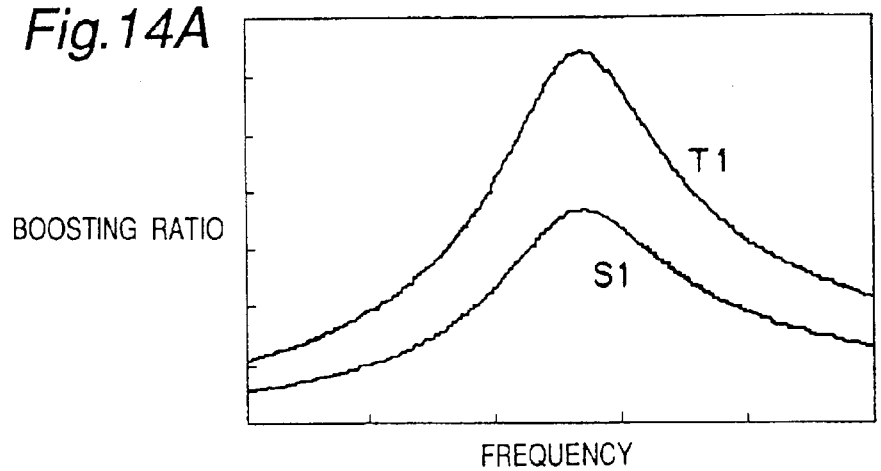
Figure 14B:
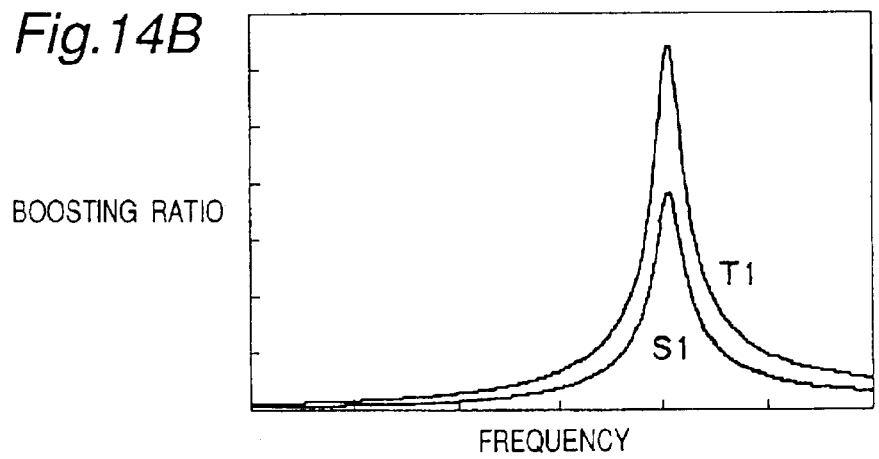

FIGS. 14A and 14B illustrate operating characteristics of the piezoelectric transformer after and before the cold cathode lump is lit up, respectively. In FIGS. 14A and 14B, the curve T1 represents the step-up ratio at the secondary electrode 312 of the piezoelectric transformer 170, and the curve S1 represents the step-up ratio at the third electrode 313 of the piezoelectric transformer 170. As shown in FIG. 14B, the voltage applied to the cold cathode lump 108 at the start-up of lighting is a high voltage obtained by the step-up ratio of the piezoelectric transformer 170 with not loaded, as expressed by T1. While the driving frequency is gradually changed to approach to the resonant frequency from a frequency higher than the resonant frequency to increase the output voltage, the cold cathode lump 108 lights up when the driving frequency reaches a lighting start voltage. At the time, the output voltage of the third electrode 313 is expressed by S1. After the cold cathode lump 108 is lit up, the operating characteristic of the step-up ratio at the secondary electrode 312 and the third electrode 313 of the piezoelectric transformer 170 is shifted to that shown in FIG. 14A and a control is performed to provide a desired level of the lamp current.

If the cold cathode lump 108 is not lit up with the lighting start voltage, the load to the piezoelectric transformer 170 is virtually infinite. As the driving frequency approaches to the resonant frequency, the output voltage expressed by the curve T1 in FIG. 14B can be output. At the start-up of lighting, the output voltage of the third electrode 313 denoted by the curve S1 is measured and compared with the voltage setting level by the comparator circuit 122. The output voltage of the third electrode 313 is increased by approximating the driving frequency to the resonant frequency until the output voltage is equal to the voltage setting level. Once the output voltage of the third electrode 313 is equal to the voltage setting level, the sweep of the driving frequency is stopped and the driving frequency is fixed to the frequency with the voltage setting level. During the above process, the phase difference detector circuit 121 and the current detector circuit 107 are stopped.

The comparator circuit 122 for overvoltage protection is stopped when the cold cathode lump 108 is lit up. The lamp current is thus controlled with the output of the current detector circuit 107 and the output of the phase difference detector circuit 121. The action of the driving circuit during the cold cathode lump 108 being lit up is identical to that explained with the fourth embodiment.

In this embodiment, the lamp current is controlled by detecting a phase difference between the input voltage to the piezoelectric transformer 170 and the output voltage from the third electrode 313. It may be controlled with equal success by measuring the step-up ratio at the third electrode 313 of the piezoelectric transformer 170 and determining the driving frequency and the driving voltage from the gradient of the step-up ratio to make the lamp current constant.

While the control in this embodiment is carried out in an analog mode, it may be carried out in a digital mode like the second embodiment.

Sixth Embodiment

Figure 15:
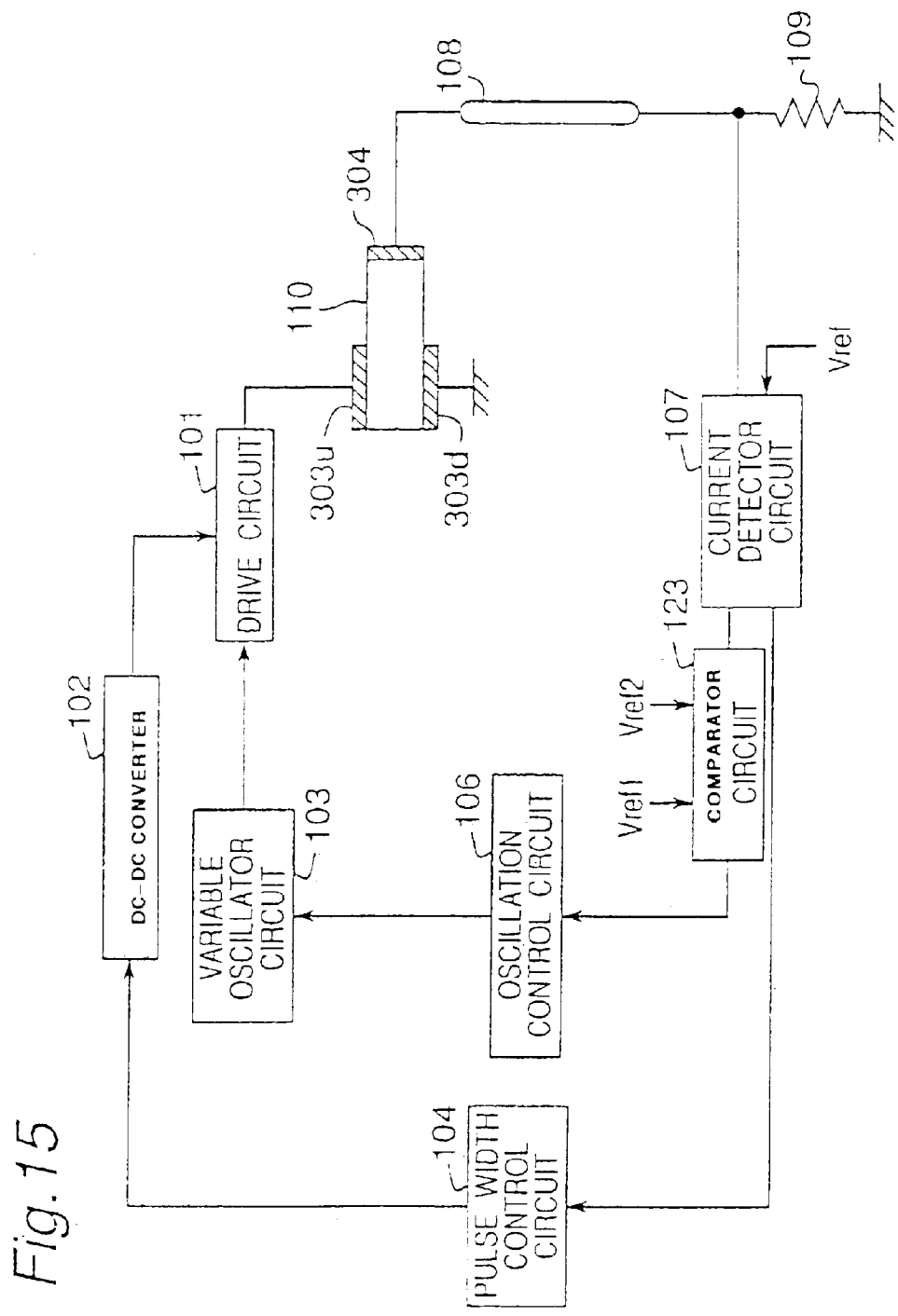
FIG. 15 is a block diagram of the sixth embodiment of the piezoelectric transformer driving circuit according to the present invention.

FIG. 15 is a block diagram of the piezoelectric transformer driving circuit of the sixth embodiment according to the present invention. The piezoelectric transformer in this embodiment is of a Rosen type of which action is described in the first embodiment.

The driving circuit of this embodiment will be described in more detail with reference to FIG. 15.

As shown in FIG. 15, a variable oscillator circuit 103 generates an alternating current drive signal for driving the piezoelectric transformer 110. The output signal of the variable oscillator circuit 103 is amplified by a drive circuit 101 to a voltage level enough to drive the piezoelectric transformer 110 and transferred to a primary electrode 303$u$ of the piezoelectric transformer 110. The output voltage of the piezoelectric transformer 110 stepped up by the piezoelectric effect thereof is output from a secondary electrode 304.

The stepped up voltage output from the secondary electrode 304 is applied to a series circuit composed of a cold cathode lump 108 and a feedback resistor 109.

The voltage developed across the feedback resistor 109 is transferred to a current detector circuit 107 which in turn supplies an oscillation control circuit 106 and a pulse width control circuit 104 with a signal for making the current across the cold cathode lump 108 uniform. The output from the current detector circuit 107 is fed to a comparator circuit 123 which determines the upper limit (defined by a reference voltage Vref1) and the lower limit (defined by a reference voltage Vref2) of the frequency from the setting level of voltage. The comparator circuit 123 compares an input voltage from the current detector circuit 107 with the two reference voltages Vref1 and Vref2. When the input voltage is greater than the reference voltage Vref2 or smaller than the reference voltage Vref1, the driving frequency is fixed. When the input voltage from the current detector circuit 107 is greater than the reference voltage Vref1 or smaller than the reference voltage Vref2, the pulse width controlling is carried out to control the input voltage for making the lamp current uniform.

Thus, by setting a range of the driving frequency for the piezoelectric transformer 110, controlling the driving voltage of the piezoelectric transformer 110 so that the lamp current remains uniform, the piezoelectric transformer 110 can be driven in a frequency range which provides a high driving efficiency. Also, a malfunction such as exceeding the resonant frequency can be avoided.

In this embodiment, a rate of modifying the frequency is not described. However, the driving frequency may be changed by smaller change width around the resonant frequency, and the change width may be larger as the distance between the driving frequency and the resonant frequency becomes larger. This will ensure the piezoelectric transformer to be driven with a higher operational reliability.

While the control is carried out in an analog mode in this embodiment, it may be carried out in a digital mode like the second embodiment.

Advantages

As set forth above, the piezoelectric transformer driving circuit of the present invention measures the gradient of the step-up ratio of the piezoelectric transformer to detect the resonant frequency of the transformer. Accordingly, the driving circuit can successfully respond to discrepancy of the resonant frequency due to variation of the piezoelectric transformer and a change in the operating characteristics of the piezoelectric transformer caused by variation of the load or the temperature, resulting in operation with high efficiency at around the resonant frequency. Further more stable drive can be ensured. With the piezoelectric transformer provided with the third electrode, measuring the step-up ratio at the third electrode to use it for the control can reduce a voltage required for the control to a relatively lower level. Further, by detecting the voltage output of the third electrode to use it for the control, the necessity of treating a high voltage signal is eliminated. Thus the smaller size of the inverter circuit can be provided.

The control circuits are arranged in an integrated circuit so as to be driven in a digital mode, thus contributing to the smaller size of the inverter circuit.

As described above, the present invention has a higher functional reliability and allows the piezoelectric inverter circuit to be implemented in a small package, hence being sufficiently useful in the practical use.

Although the present invention has been described in connection with specified embodiments thereof, many other modifications, corrections and applications are apparent to those skilled in the art. Therefore, the present invention is not limited by the disclosure provided herein but limited only to the scope of the appended claims.

The present disclosure relates to subject matter contained in priority Japanese Patent Application No. 2000-249751, filed on Aug. 21, 2000, the contents of which is herein expressly incorporated by reference in its entirety.

What is claimed is:

1. A method of driving a piezoelectric transformer with a primary electrode and a secondary electrode, the piezoelectric transformer stepping up a voltage input at the primary electrode with a step-up ratio which varies depending on a frequency according to a piezoelectric effect, and releasing the stepped up voltage from the secondary electrode, the method comprising:
   detecting a linear differential value of the step-up ratio of the piezoelectric transformer with respect to the frequency; and
   controlling the driving frequency for the piezoelectric transformer according to the detected linear differential.

2. The method of driving a piezoelectric transformer according to claim 1, wherein the frequency modifying rate at the sweep of the driving frequency for the piezoelectric transformer is changed according to the linear differential value of the step-up ratio of the piezoelectric transformer with respect to the frequency.

3. The method of driving a piezoelectric transformer according to claim 2, wherein the greater the change rate of the linear differential value of the step-up ratio of the piezoelectric transformer, the smaller the frequency modifying rate at the sweep of the driving frequency for the piezoelectric transformer is.

4. The method of driving a piezoelectric transformer according to claim 1, wherein a range for sweeping the driving frequency for the piezoelectric transformer is determined.

5. The method of driving a piezoelectric transformer according to claim 4, wherein the driving frequency for the piezoelectric transformer is determined in a range so as not to exceed the resonant frequency of the piezoelectric transformer.

6. A power source apparatus comprising:
   a piezoelectric transformer with a primary electrode and a second electrode for stepping up a voltage input at the primary electrode by the piezoelectric effect to output the stepped up voltage from the secondary electrode;
   a driving section for driving the piezoelectric transformer at a desired voltage and at a desired frequency;
   a current detecting section for measuring a current across a load which is driven by the voltage output from the secondary electrode of the piezoelectric transformer;
   a step-up ratio differential detecting section for determining a linear differential value of the step-up ratio of the piezoelectric transformer with respect to the frequency; and
   a control section for controlling the driving frequency and the driving voltage for the piezoelectric transformer according to the current across the load detected by the current detecting section and the linear differential value determined by the step-up ratio differential detecting section.

7. The power source apparatus according to claim 6, wherein the control section controls the driving frequency based on the output of the current detecting section so that the driving frequency is varied within a predetermined frequency range, and that the driving voltage for the piezoelectric transformer is varied when the driving frequency reaches the maximum or minimum limit of the predetermined frequency range.

8. The power source apparatus according to claim 6, wherein the control section modifies a frequency modifying rate at the sweep of the driving frequency according to a difference between the driving frequency for the piezoelectric transformer and the resonant frequency of the piezoelectric transformer.

9. The power source apparatus according to claim 8, wherein the control section comprises an A/D converter for converting the detection signal from the current detecting section which is an analog signal into a digital signal, and an arithmetic operating section for processing data represented by the digital signal with the use of a program stored in a memory, and the control section can generate control signals from the arithmetic operation to determine the driving frequency and driving voltage of the piezoelectric transformer.

10. The power source apparatus according to claim 9, wherein the control section is fabricated in the form of an integrated circuit.

11. A method of driving a piezoelectric transformer with a primary electrode, a secondary electrode and a third electrode, the piezoelectric transformer stepping up a voltage input at the primary electrode with a step-up ratio which varies depending on a frequency by a piezoelectric effect, and releasing the stepped up voltage from the secondary electrode and the third electrode, the method comprising:
   detecting a linear differential value of a voltage ratio between the voltage input at the primary electrode and the voltage output from the third electrode to the frequency; and
   controlling the driving frequency for the piezoelectric transformer according to the detected linear differential value of the voltage ratio.

12. The method according to claim 11, further comprising:
   detecting the voltage output from the third electrode; and
   controlling the output voltage of the piezoelectric transformer not to exceed a predetermined voltage level, thereby carrying out the overvoltage protection of the piezoelectric transformer.

13. The method of driving a piezoelectric transformer according to claim 11, wherein the frequency modifying rate at the sweep of the driving frequency for the piezoelectric transformer is changed according to the linear differential value of the step-up ratio of the piezoelectric transformer with respect to the frequency.

14. The method of driving a piezoelectric transformer according to claim 13, wherein the greater the change rate of the linear differential value of the step-up ratio of the piezoelectric transformer, the smaller the frequency modifying rate at the sweep of the driving frequency for the piezoelectric transformer is.

15. The method of driving a piezoelectric transformer according to claim 11, wherein a range for sweeping the driving frequency for the piezoelectric transformer is determined.

16. The method of driving a piezoelectric transformer according to claim 15, wherein the driving frequency for the piezoelectric transformer is determined in a range so as not to exceed the resonant frequency of the piezoelectric transformer.

17. A power source apparatus comprising:
   a piezoelectric transformer with a primary electrode, a secondary electrode and a third electrode for stepping up a voltage input at the primary electrode by the piezoelectric effect to output the stepped up voltage from the secondary electrode and the third electrode;
   a driving section for driving the piezoelectric transformer at a desired voltage and at a desired level frequency;
   a current detecting section for detecting a current across a load which is driven by the voltage output from the secondary electrode of the piezoelectric transformer;
   a step-up ratio differential detecting section for determining a linear differential value of a voltage ratio between the driving voltage for the piezoelectric transformer and the voltage output from the third electrode, to the frequency; and
   a control section for controlling the driving frequency and the driving voltage for the piezoelectric transformer based on the current detected by the current detecting section and the linear differential value of the step-up ratio determined by the step-up ratio detecting section so that the current across the load is at a predetermined level.

18. The power source apparatus according to claim 17, wherein the control section controls the driving frequency based on the output of the current detecting section so that the driving frequency is varied within a predetermined frequency range, and that the driving voltage for the piezoelectric transformer is varied when the driving frequency reaches the maximum or minimum limit of the predetermined frequency range.

19. The power source apparatus according to claim 17, wherein the control section modifies a frequency modifying rate at the sweep of the driving frequency according to a difference between the driving frequency for the piezoelectric transformer and the resonant frequency of the piezoelectric transformer.

20. The power source apparatus according to claim 19, wherein the control section comprises an A/D converter for converting the detection signal from the current detecting section which is an analog signal into a digital signal, and an arithmetic operating section for processing data represented by the digital signal with the use of a program stored in a memory, and the control section can generate control signals from the arithmetic operation to determine the driving frequency and driving voltage of the piezoelectric transformer.

21. The power source apparatus according to claim 20, wherein the control section is fabricated in the form of an integrated circuit.

* * * * *